United States Patent
Higashi et al.

(10) Patent No.: US 7,210,864 B2
(45) Date of Patent: May 1, 2007

(54) COATING AND DEVELOPING APPARATUS

(75) Inventors: Makio Higashi, Tokyo (JP); Akira Miyata, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 121 days.

(21) Appl. No.: 11/028,315

(22) Filed: Jan. 4, 2005

(65) Prior Publication Data
US 2005/0217581 A1    Oct. 6, 2005

(30) Foreign Application Priority Data
Mar. 31, 2004 (JP) ............................. 2004-106132

(51) Int. Cl.
*G03D 5/00* (2006.01)

(52) U.S. Cl. ..................... 396/611; 355/27; 414/935

(58) Field of Classification Search .................. 355/27; 396/611
See application file for complete search history.

(56) References Cited

U.S. PATENT DOCUMENTS 6,507,770 B2    1/2003    Tateyama et al. ............ 700/228

FOREIGN PATENT DOCUMENTS

JP    2001-351848    12/2001

*Primary Examiner*—D. Rutledge
(74) *Attorney, Agent, or Firm*—Oblon, Spivak, McClelland, Maier & Neustadt, P.C.

(57) ABSTRACT

A wafer flow recipe is prepared. Based on this wafer flow recipe, there are estimated and calculated respectively a PCD time from a time point at which a process for coating a resist liquid on a substrate by a coating unit has been terminated to a time point at which a first heating process is started at a first heating unit, a PAD time from a time point at which the first heating process has been terminated at the first heating unit to a time point at which an exposure process is started, and a PED time from a time point at which the exposure has been terminated to a time point at which a second heating process is started at a second heating unit. Then, these estimated times are displayed.

18 Claims, 14 Drawing Sheets

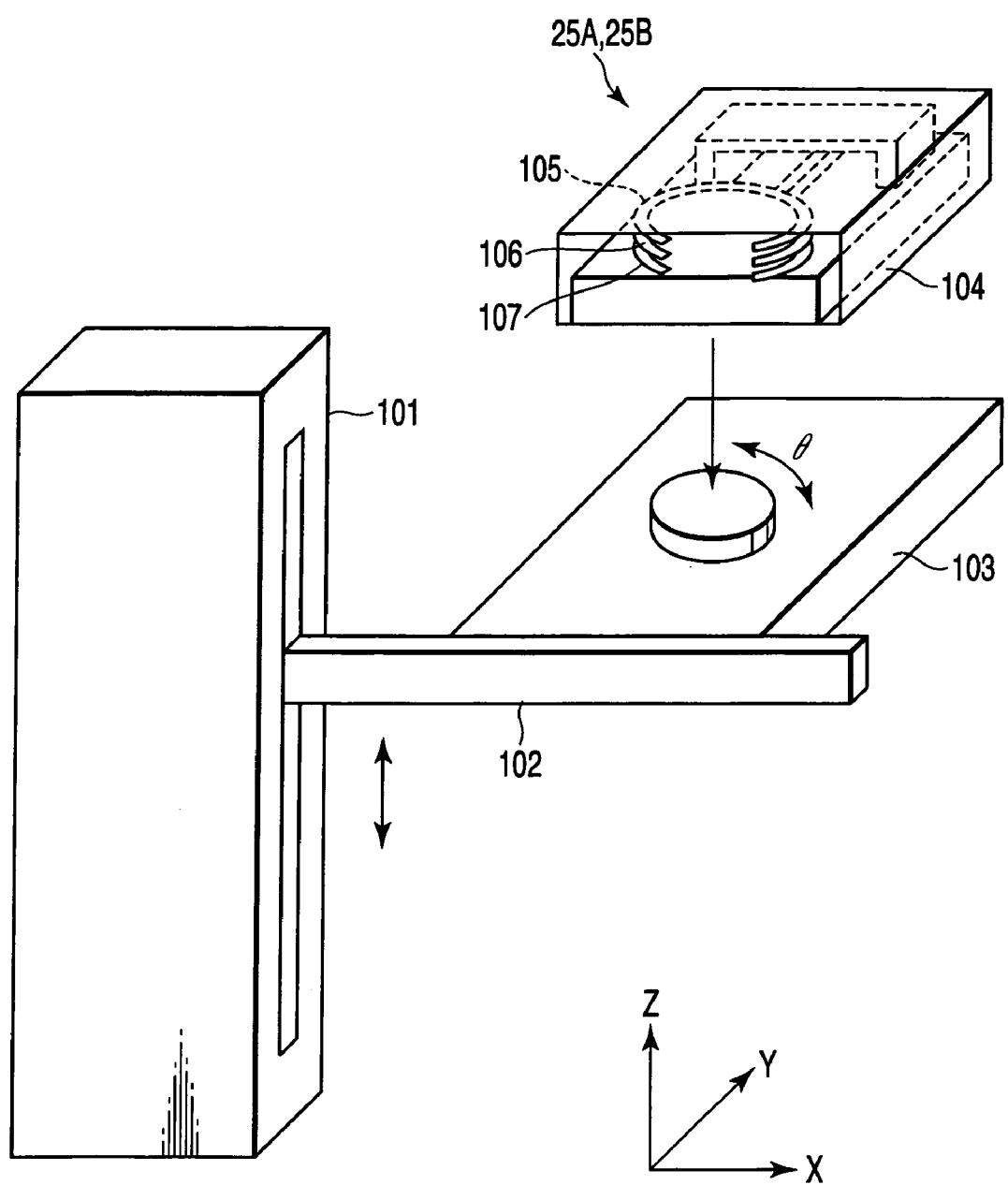
F I G. 4

Wafer Flow Recipe Information

| | |
|---|---|
| 1st cycle time | OOO sec. |
| 2nd cycle time | OOO sec. |
| 3rd cycle time | OOO sec. |
| PCD time | OOO sec. |
| PED maximum time | OOO sec. |
| PED minimum time | OOO sec. |
| PAD time | OOO sec. |

F I G. 1 4

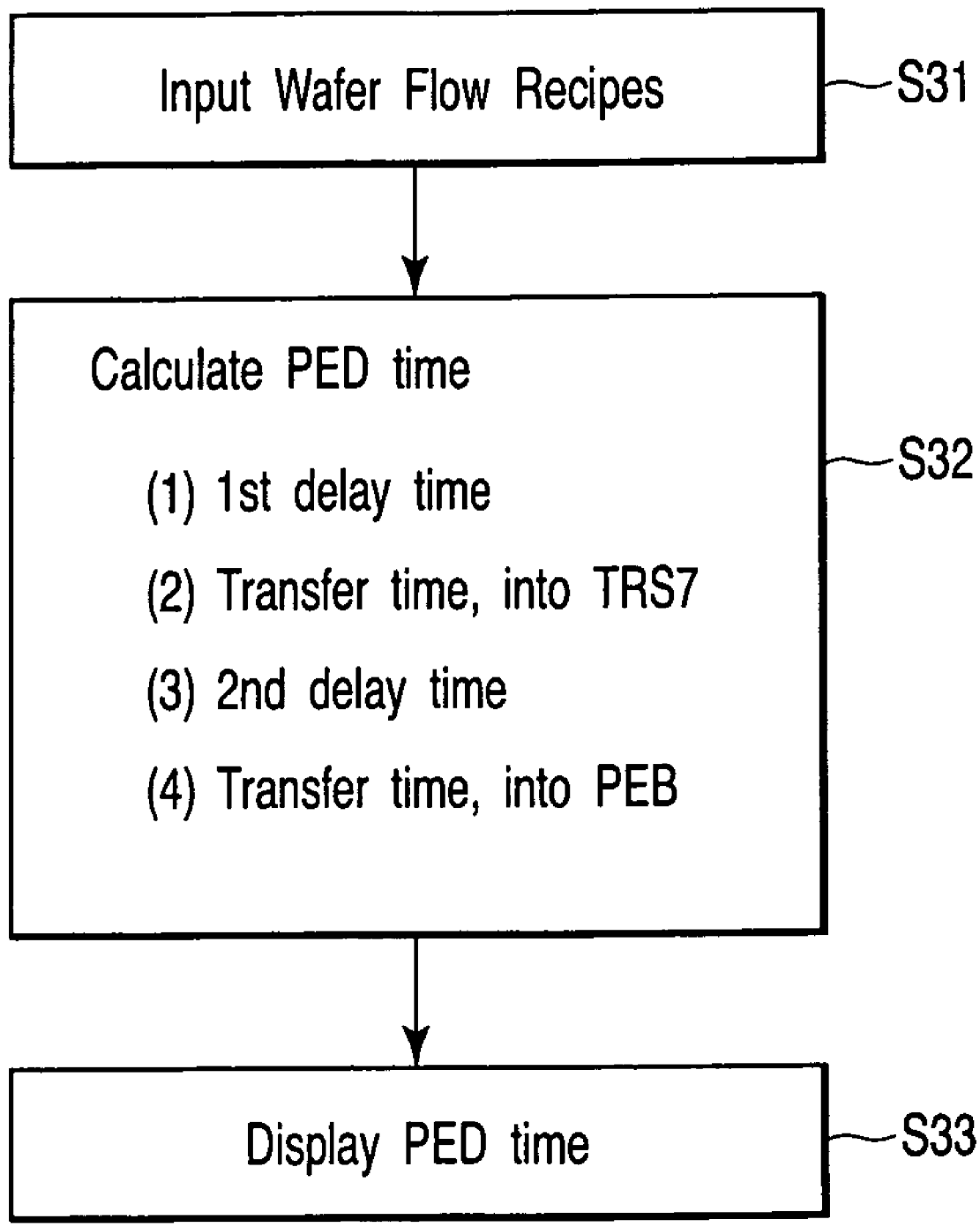
F I G. 15

COATING AND DEVELOPING APPARATUS

CROSS-REFERENCE TO RELATED APPLICATIONS

This application is based upon and claims the benefit of priority from prior Japanese Patent Application No. 2004-106132, filed Mar. 31, 2004, the entire contents of which are incorporated herein by reference.

BACKGROUND OF THE INVENTION

1. Field of the Invention

The present invention relates to a coating and developing apparatus for carrying out coating and developing processes of, for example, a resist liquid to a semiconductor wafer or an LCD substrate (a glass substrate for liquid crystal display).

2. Description of the Related Art

For example, a coating and developing apparatus described in the U.S. Pat. No. 6,507,770 is used in combination with an exposure device in order to execute a series of processes applying a photolithography technique. As shown in FIG. 1, a conventional apparatus comprises a carrier placing section 1A, a process section 1B, and an interface section 1C. The process section 1B comprises a transfer mechanism 12, a liquid processing unit group 14, and a rack unit 13 (13a to 13c). The transfer mechanism 12 comprises, for example, two or more arms at its center. The liquid processing unit group 14 is allocated at the periphery of the transfer mechanism 12, and comprises a coating unit which coats a resist liquid or the like to a wafer W, and a developing unit which carries out a developing process of a resist film exposed in a pattern. The rack unit 13 (13a to 13c) comprises a baking unit which heats the wafer W, a temperature control unit which controls a temperature of the wafer, and a delivery unit which delivers the wafer between the delivery unit 12 and the rack unit 13. The liquid processing unit group 14 and the rack unit 13 (13a to 13c) are stacked in a vertically multi-stepped manner, respectively. An exposure system 1D is provided as an external system connected that is to the coating and developing apparatus via an interface block 1C.

In such a conventional apparatus, the wafer W is taken out from a carrier C of the carrier placing block 1A by a delivery arm 11, and is transferred to the process block 1B via the delivery unit of the rack unit 13a. Then, a predetermined process is applied after the wafer W has been transferred to a predetermined processing unit in accordance with a predetermined sequence. After a resist liquid has been coated, the wafer is transferred to the exposure system ID via the interface block 1C, and a resist film is exposed in a pattern. Then, the wafer W is returned again to the process block 1B after exposure, is subjected to post exposure baking by a baking unit, is cooled by a cooling unit, and is developed by a developing unit.

Recently, with a finer semiconductor device circuit pattern, high processing precision is required for each process and each step of photolithography, and a line width of a circuit pattern is reduced. From such a background, a wafer transfer time between processes is different from another one. If a deviation occurs with a time from a time point of the end of process of the previous step to a time point of starting of process of a next step, the processing of each step is affected. As a result, there is a danger that a deviation occurs with the line with.

Here, a factor causing an adverse effect on the process is not always all the wafer transfer times between processes. Adverse effects on processes are believed to be a PCD time (Post Coating Delay Time), a PAD time (Post Apply Back Delay Time), and a PED time (Post Exposure Delay Time). In the conventional apparatus of the U.S. Pat. No. 6,507,770, prior to carrying out an actual process, time intervals (allowable time intervals) of the PCD time, the PAD time, and PEB Time which does not affect a process such as a small deviation of a circuit line width or the like are obtained in advance, and a wafer transfer schedule is determined so that the PCD time or the like is included in these time intervals (allowable time intervals).

The wafer transfer schedule is determined as follow. First, an operator specifies type and sequence of processing units scheduled for use in a process of manufacturing a customer's specification, and a wafer flow recipe is prepared based on these specified items. Then, this wafer flow recipe is input as data in a process computer. The computer carries out computation based on the wafer flow recipe, and determines the wafer transfer schedule. Further, the computer controls operations of a plurality of transfer mechanisms, respectively, in accordance with the wafer transfer schedule, whereby each wafer W is present at a predetermined time in a predetermined location.

In the meantime, in the prior art of the U.S. Pat. No. 6,507,770, based on the wafer transfer schedule, the PCD time, PAD time, and PED time are obtained by actually processing a product wafer W or supplying a dummy wafer DW. If the obtained PCD time, PAD time, and PED time are improper, the operator recreates the wafer flow recipe, and corrects the number of processing units used or sequence thereof. Then, the product wafer W or dummy wafer DW is actually supplied again in line based on a new wafer transfer schedule, and the PCD time or the like is obtained again.

However, in the prior art, since the product wafer W or the like is actually supplied in line, an excessive amount of work cost or time is required. In addition, if the obtained PCD time or the like is improper, the product wafer W supplied in line becomes unavailable or the dummy wafer W becomes wasteful.

There may be used a technique for restraining a deviation of transfer times of each wafer by making a cycle time control such that all the transfer times of wafers between processes are completely identical to each other. However, according to this technique, although the PCD time and PED time become constant between wafers, it is impossible to identify the time itself such as the PCD time as long as the wafer W is actually supplied, and the PAD time is not constant even if this cycle time control is made. In addition, in this technique, a transfer time is limited in accordance with a process defined as a rate-determining (for example, a developing process), and thus, throughput may be lowered.

BRIEF SUMMARY OF THE INVENTION

It is an object of the present invention to provide a coating and developing apparatus and a program capable of predicting a deviation of circuit line widths or the like without actually processing a substrate.

According to an aspect of the present invention, there is provided a coating and developing apparatus comprising: a module group which processes a plurality of substrates in parallel, the module group including a resist coating unit, a first heating unit which carries out a first heating process of a resist coated film before exposed, and a developing unit which carries out a developing process of a resist coated film after exposed; and a plurality of substrate transfer mechanism configured to transfer a substrate to each unit of the module group, the apparatus having: a substrate flow recipe creation section which specifies a transfer sequence of substrates for each unit of the module group to create a substrate flow recipe; a estimated time calculating section which, based on the substrate flow recipe, estimates and calculates a first time interval from a time point at which a process for coating a resist liquid on the substrate by the coating unit has been terminated to a time point at which the first heating process is started at the first heating unit; and a estimated time display section which displays the estimated and calculated time by the estimated time calculating section.

Further, the estimated time calculating section estimates and calculates a second time interval from a time point at which the first heating process has been terminated at the first heating unit to a time point at which an exposure process is started, based on the substrate flow recipe.

Furthermore, the module group further has a second heating unit which carries out a second heating process to the resist coated film after exposed. In this case, the estimated time calculating section estimates and calculates a third time interval from a time point at which the exposure process has been terminated to a time point at which the second heating process is started at the second heating unit, based on the substrate flow recipe.

According to another aspect of the present invention, there is provided a program to be executed by a computer system, the program controlling a coating and developing apparatus, the coating and developing apparatus comprising a module group which processes a plurality of substrates, the module group including a resist coating unit, a first heating unit which carries out a first heating process for a resist coated film before exposed, a second heating unit which carries out a second heating process for a resist coated film after exposed, and a developing unit which carries out a developing process for the resist coated film after exposed; and a plurality of substrate transfer mechanism configured to transfer a substrate to each unit of the module group, the program comprising:

(a) a procedure for executing processing of specifying a transfer sequence of substrates for each unit of the module group to create a substrate flow recipe;

(b) a procedure for executing processing of, based on the substrate flow recipe, estimating and calculating a first time interval (PCD time) from a time point at which a process for coating a resist liquid on the substrate by the coating unit has been terminated to a time point at which the first heating process is started at the first heating unit, a second time interval (PAD time) from a time point at which the first heating process has been terminated at the first heating unit to a time point at which an exposure process is started; and a third time interval (PED time) from a time point at which the exposure has been terminated to a time point at which the second heating process is started at the second heating unit; and (c) a procedure for executing processing of displaying the estimated and calculated time.

Here, in the coating and developing apparatus according to the present invention, any one or two of the first time interval (PCD time), the second time interval (PAD time), and the third time interval (PED time) may be estimated and calculated or all the times may be estimated and calculated so as to display a estimated time.

In the present invention, when the operator has created the substrate flow recipe by using the recipe creation section, any one or two or all of the first time interval (PCD time), the second time interval (PAD time), and the third time interval (PED time) are estimated and calculated, and the estimated time is displayed. Thus, the PED time or the like can be grasped without actually supplying a substrate to the apparatus. This is because there is a correlation between a deviation of the PCD times or the like and a deviation of circuit pattern line widths or the like, and thus, if the estimated times are known, a deviation of the circuit pattern line widths or the like can be estimated. Further, in the case where any two or all of the first time, second time, and third time are estimated and calculated, and the estimated time is displayed, a deviation of the circuit pattern line widths can be reduced by adjusting a substrate flow recipe so that a deviation of a total processing time totalizing the first time, the second time, and the third time becomes the minimum (hereinafter, referred to as a "deviation of the transfer processing time").

In the present specification, the "PCD time" is defined as a time from the end of a process for coating a resist by a coating unit to the start of a pre-baking process by a heating unit (Post Apply Base; PAB).

The "PAD time" is defined as a time from the end of the pre-baking process at the heating unit (PAB) to the start of an exposure process by an exposure device.

The "PED time" is defined as a time from the end of the exposure process at the exposure device to the start of a post exposure baking process by a heating unit (Post Exposure Base; PEB).

The "substrate flow recipe (wafer flow recipe)" is defined as a kind of database for an operator to specify and create type and sequence of processing units for use a series of processes under a specification.

The "substrate transfer schedule (wafer transfer schedule)" is defined as a kind of time table for, in the case where all the wafers W belonging to the same lot are subjected to continuous processing, predetermining at which timing each wafer W is transferred and to which module such each wafer W is transferred.

BRIEF DESCRIPTION OF THE SEVERAL VIEWS OF THE DRAWING

FIG. 4 is a perspective view showing a main transfer mechanism of a process section;

FIG. 14 is a timing chart show an example of a screen when a calculation result of the PCD time or the like has been displayed; and FIG. 15 is a process chart showing procedures when the PED time is estimated and calculated.

DETAILED DESCRIPTION OF THE INVENTION

Hereinafter, preferred embodiments of the present invention will be described with reference to the accompanying drawings.

Figure 1:
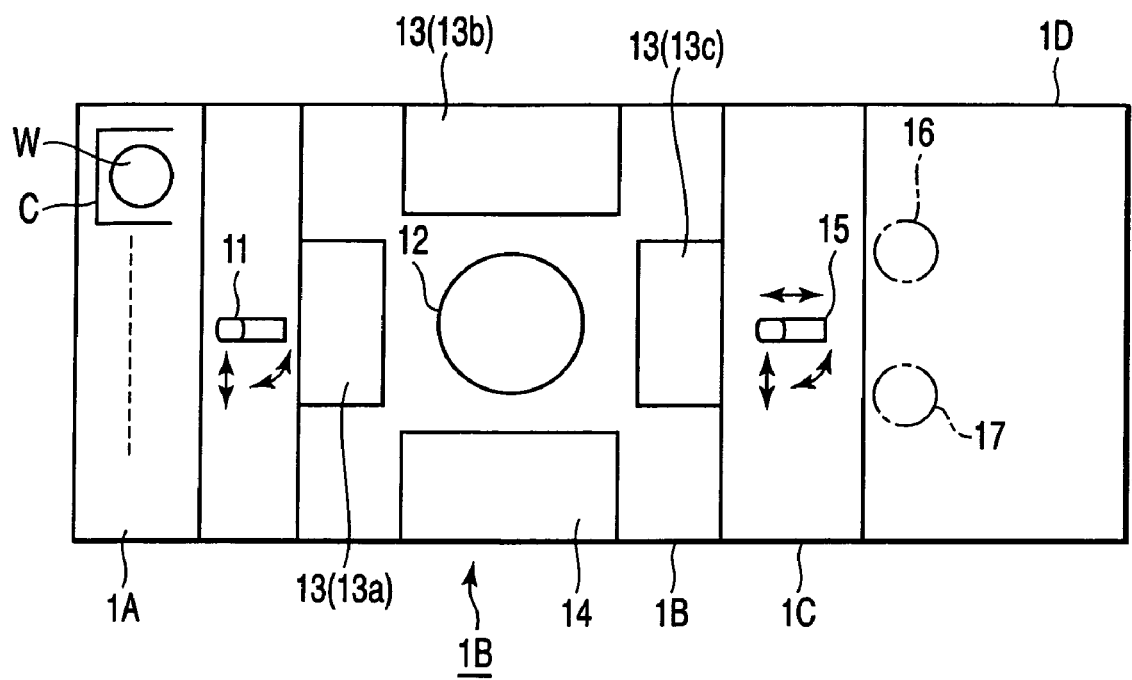
FIG. 1 is a schematic plan view showing a conventional apparatus.
Figure 2:
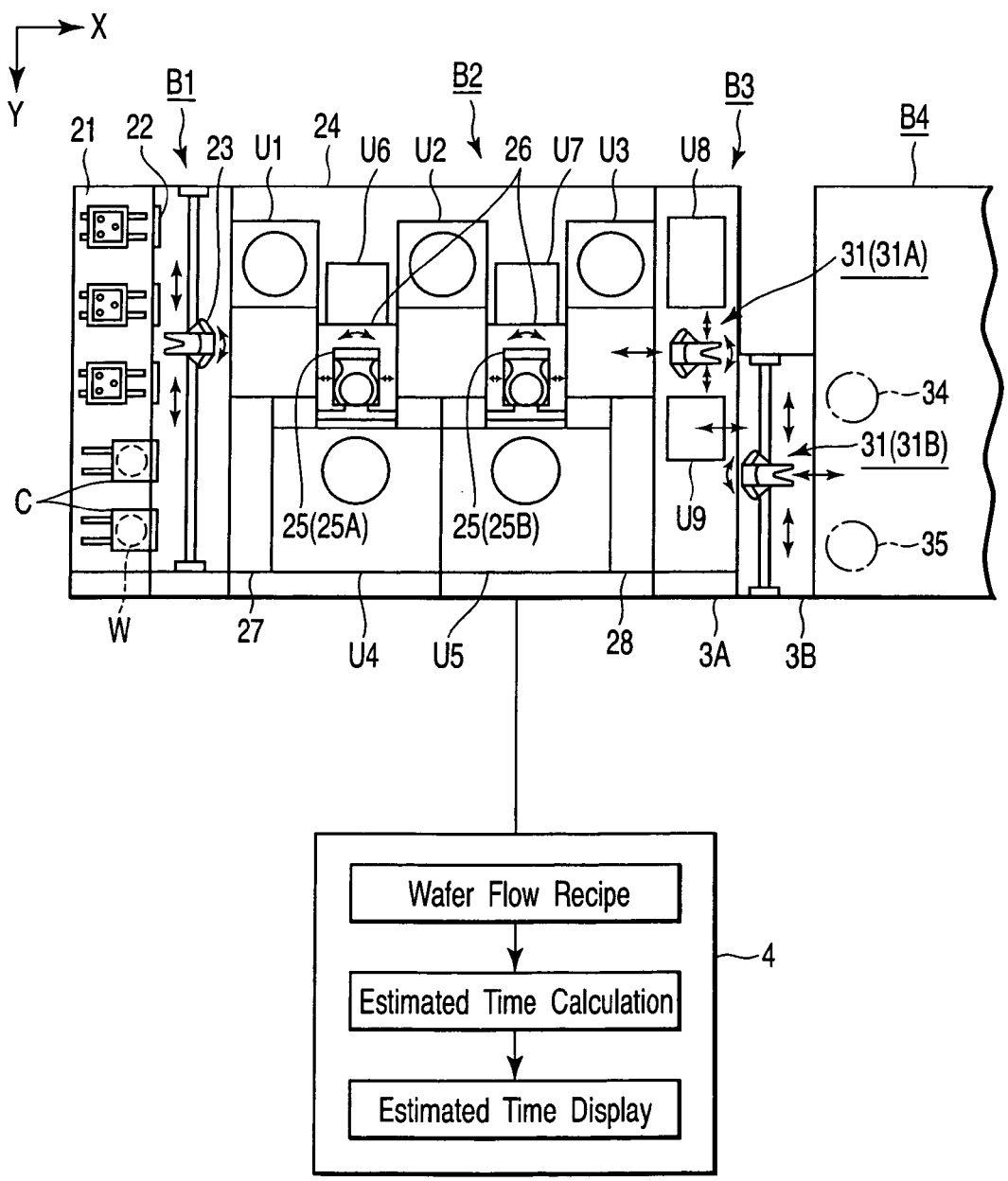
FIG. 2 is a plan view of a block depicting a coating and developing apparatus according to the present invention.
Figure 3:
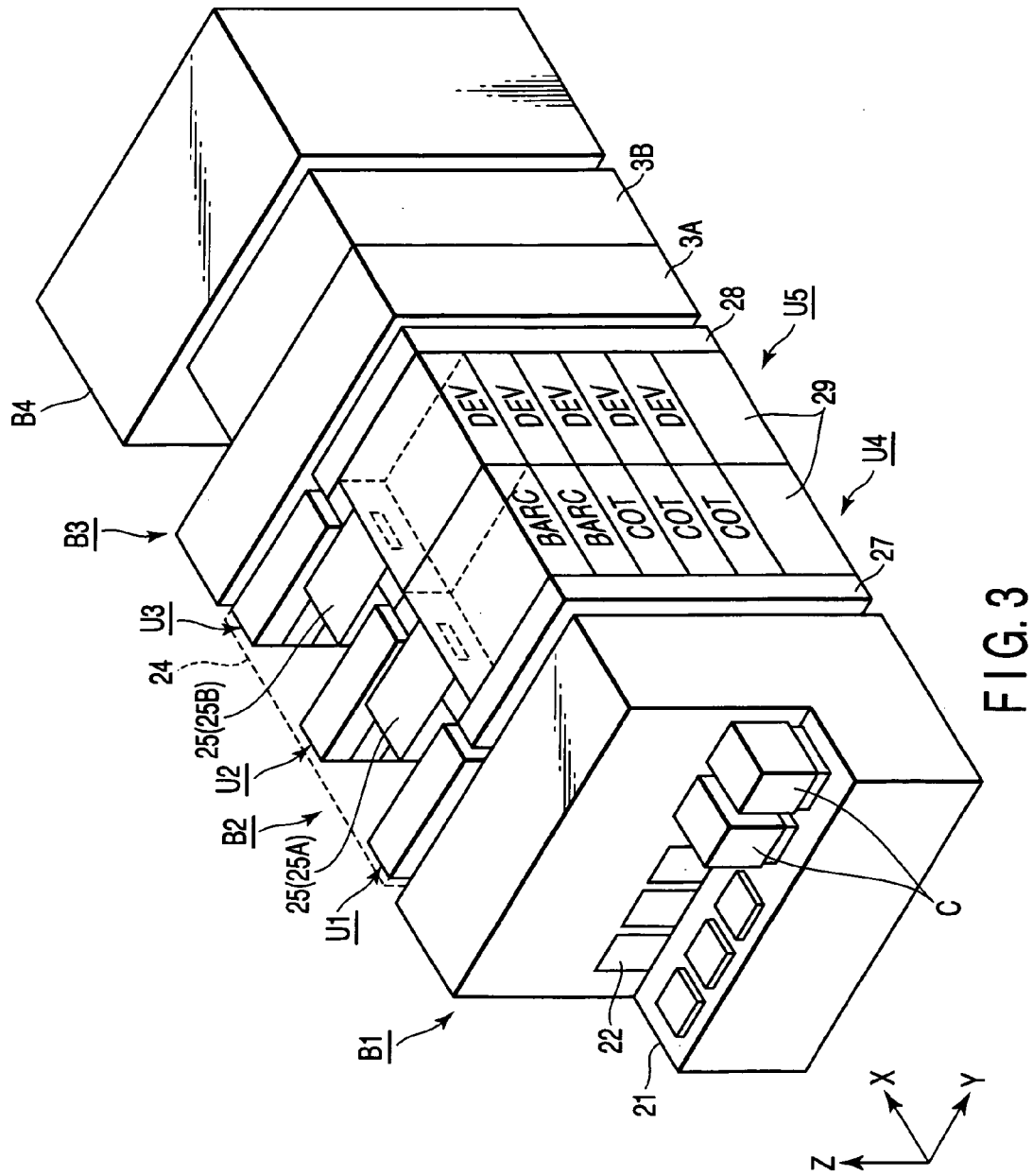
FIG. 3 is a perspective view showing an outline of the coating and developing apparatus.

Reference numeral B1 of FIGS. 2 and 3 denote a carrier placing section which imports or exports a carrier C. In the carrier C, for example, 13 semiconductor wafers W are sealed and housed. The carrier placing block B1 comprises: a placing base 21 capable of placing a plurality of carriers C; an opening and closing section 22 provided at a frontal wall face viewed from this placing base 21; and a transfer arm 23 for taking out a wafer W from the carrier C via the opening and closing section 22.

A process block B2 surrounded by a housing 24 is connected to the carrier placing block B1. At this process block B2, three rack units U1, U2, and U3 and two main transfer mechanisms 25A and 25B are alternately allocated. Shield plates (not shown) each having an opening are provided between these rack units U1, U2, and U3 and the main transfer mechanism 25A and 25B. The wafer W is designed to be transferred in the process block B2 through these openings by means of the main transfer mechanisms 25A and 25B. The rack units U1, U2, and U3 each comprise heat treatment system units BAKE, PAB, PEB, CPL, and TRS, respectively, stacked in a multi-stage manner.

As shown in FIG. 2, the first main transfer mechanism 25A is allocated in a space whose four faces are surrounded by one side face of the rack unit 1; one side face of the rack unit U2; one side face of a liquid treatment unit U4; and a wall face of a zone wall 26. In addition, the second main transfer mechanism 25B is allocated in a space whose four faces are surrounded by one side face of the rack unit U2; one side face of the rack unit U3; one side face of a liquid treatment unit U5; and a wall face of the zone wall 26. The zone walls 26 each are provided among the rack units U1, U2, and U3.

Further, rack units U6 and U7 multi-staging a hydrophobic treatment unit, a heating unit and the like are allocated, respectively, in the vicinity of the main transfer mechanisms 25A and 25B. Reference numerals 27 and 28 shown in FIG. 3 each denote a temperature control device for a treatment liquid to be used in each module, a duct for temperature and humidity control, and the like.

The liquid treatment units U4 and U5, as shown in FIG. 3, are configured to laminate a reflection-proof film coating unit (BARC); a resist coating unit (COT); and a developing unit (DEV) in a plurality of stages, for example, in 5 stages, on a housing section 29 which forms a chemical supply space for a reflection-proof film chemical, a resist liquid, a developing liquid and the like. For the purpose of clarifying terms, the reflection-proof film coating unit is called a reflection-proof unit, and the resist coating unit is called a coating unit.

In addition, the rack units U1, U2, U3, U6, and U7 described previously are configured to laminate a variety of units for carrying out pre-processing and post-processing of processing to be carried out by the liquid treatment units U4 and U5 in a plurality of stages. For example, the rack units U1, U2, and U3 are configured to laminate a variety of units in 10 stages, and the rack units U6 and U7 are configured to laminate a variety of units in 5 stages. In FIG. 3, the rack units U6 and U7 are not shown.

FIG. 4 is an exploded view showing a part of the main transfer mechanism 25 (25A and 25B). Reference numeral 101 denotes a column. In actuality, the same column (not shown) is allocated to be opposed thereto at the right side shown in FIG. 4. An elevating bar 102 is provided between the pair of columns 101. A substrate 103 is fixed to the elevating bar 102, and an arm mechanism 104 is mounted rotatably (by θ) around a vertical axis on the substrate 103. The arm mechanism 104 comprises independently three retractable arms 105 to 107. Therefore, the main transfer mechanism 25A (25B) is rotatable in a retractable and elevatable manner and around a Z axis, and the wafer W can be transferred among units of the rack units U1, U2, and U6 and the liquid treatment unit U4 (rack units U2, U3, and U7 and liquid treatment unit U5). Such a main transfer mechanism 25 (25A and 25B) is controlled to be driven by a controller based on a command from a control section described later.

Figure 5:
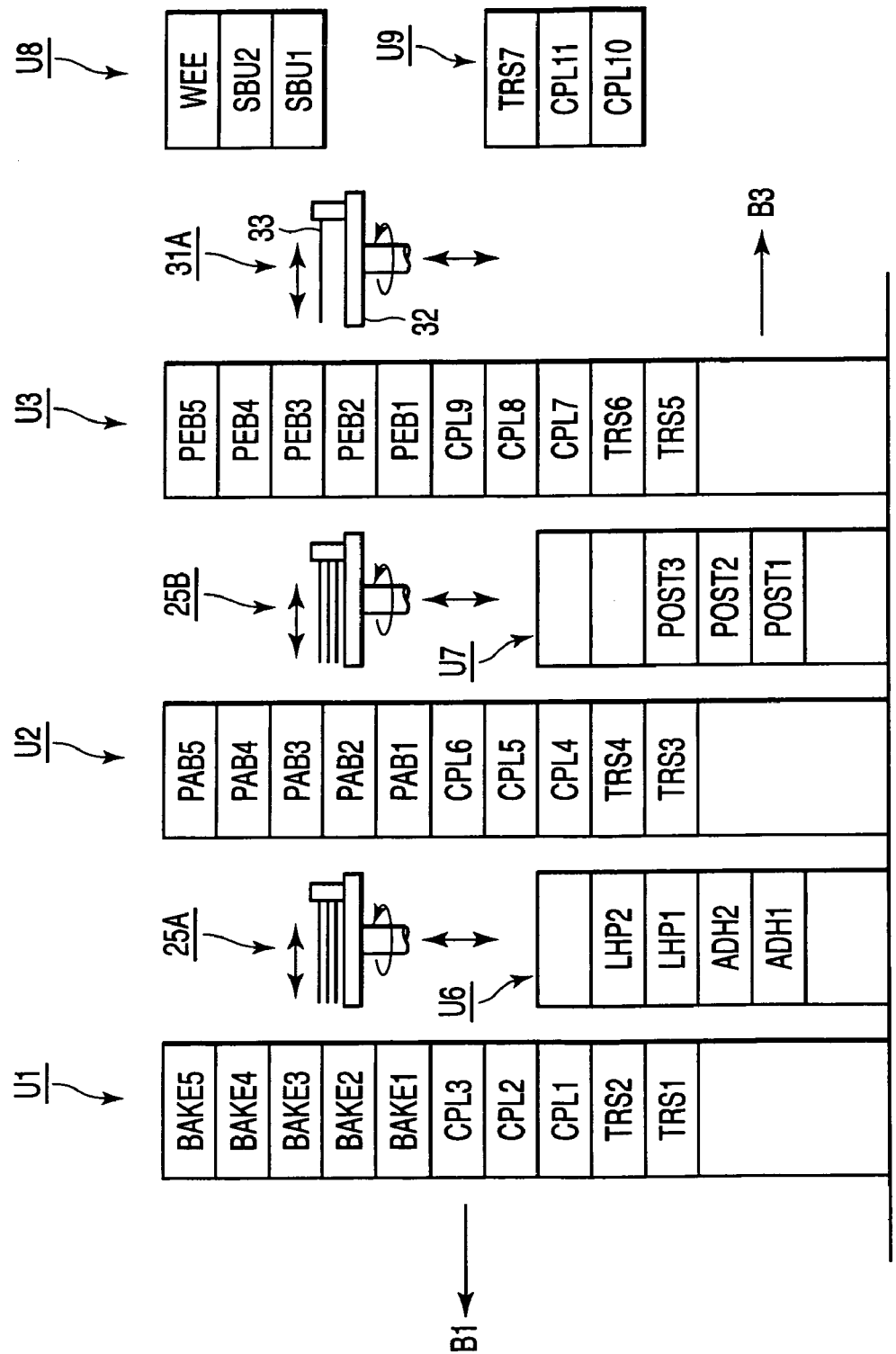
FIG. 5 is a schematic side view showing a rack unit of the process section.

As shown in FIG. 5, a variety of units include: delivery units (TRS1 to TRS6); hydrophobic treatment units (ADH1 and ADH2); temperature control units (CLP1 to CLP9) for controlling the wafer W at a predetermined temperature; heating units (BAKE1 to BAKE5) for carrying out a heating process of the wafer W before coating a resist liquid; first heating units (PAB1 to PAB5) called pre-baking units or the like for carrying out a heating process of the wafer W after coating a resist liquid; second heating units (PEB1 to PEB5) called a post exposure baking unit for carrying out a heating process of the wafer after exposed: heating units (POST1 to POST3) called post baking units for carrying out a heating process of the wafer W after developed; and heating units (LHP1 and PLH2) called hot plates for carrying out a heating process of the wafer W. FIG. 5 shows an example of a layout of these units. In the actual apparatus, the number of unit setups increases or decreases according to a specification.

As shown in FIG. 2, an interface block B3 is provided at a read end of the process block B2, and an exposure system (external system) B4 is connected to the interface block B3. The interface block B3 comprises two transfer chambers 3A and 3B. The first transfer chamber 3A (main transfer chamber) comprises two rack units U8 and U9 and a main transfer mechanism 31A (second transfer means). The main transfer mechanism 31A, as shown in FIG. 5, has: a substrate 32 which can be elevated in a Z-axis direction and which can be rotated along the Z axis; and an arm holder 33 which can slide in a horizontal direction along the substrate 32. The second transfer chamber 3B (subsidiary transfer chamber) comprises a subsidiary transfer mechanism 31B (second transfer means) which delivers the wafer W between the transfer chamber and the main transfer mechanism 31A. This subsidiary transfer mechanism 31B is configured to be substantially identical to the main transfer mechanism 31A. These second transfer means 31A and 31B are controlled to be driven based on a command from the control section 4.

The rack unit U8 of the first transfer chamber 3A comprises: an edge exposure device (WEE) for selectively exposing only an edge portion of the wafer W; and two buffer cassettes (SBU1 and SBU2) which temporarily house the wafer(s) W (for example, 25 wafers), for example. The rack unit U9 comprises: a delivery unit (TRS7) and two high precision temperature units (CPL10 and CPL11) each having a cooling plate, for example. Reference numeral 34 shown in FIG. 2 denotes an IN stage for delivering the wafer W to the exposure system B4. In addition, reference numeral 35 shown in FIG. 2 denotes an OUT stage for exporting the wafer W from the exposure system B4. The auxiliary transfer mechanism 31B provides an access to these stages 34 and 35.

Figure 6:
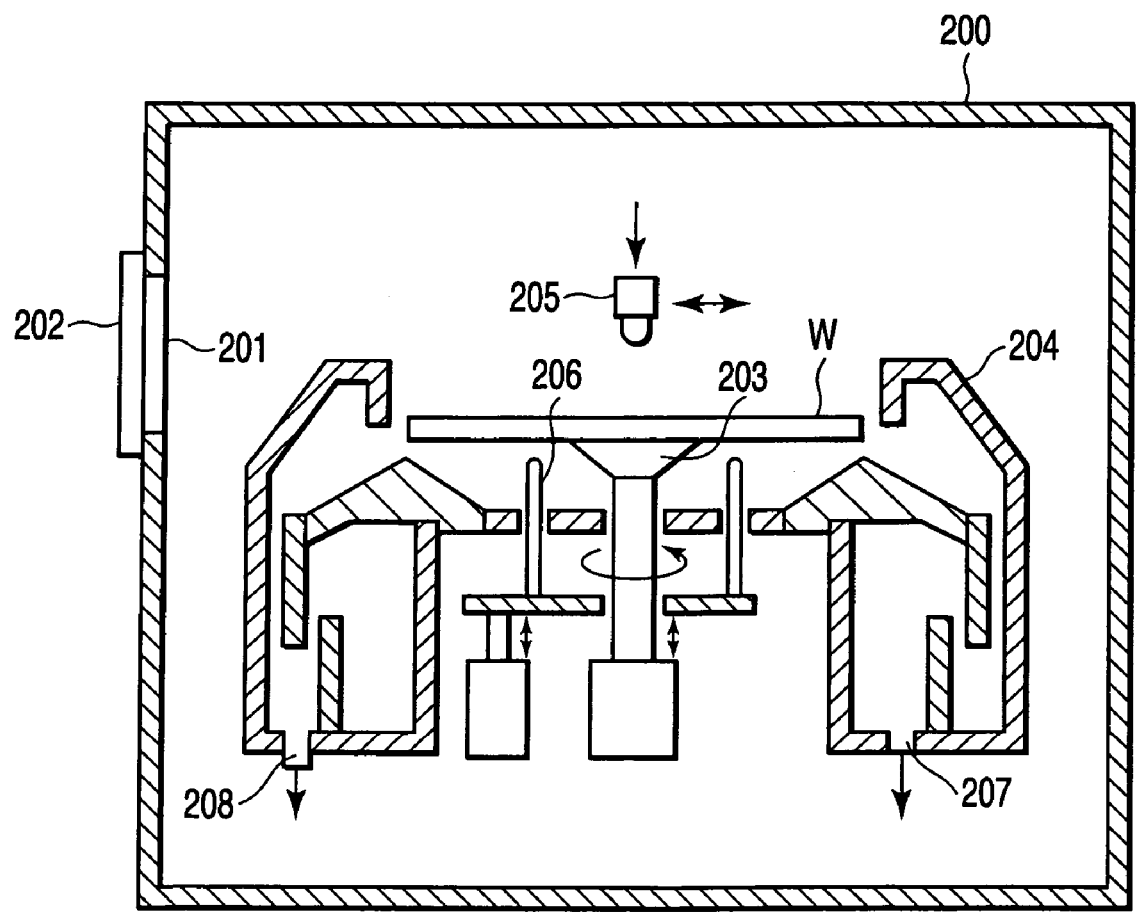
FIG. 6 is a longitudinal cross section showing a coating unit of the process section.

Now, the coating unit (COT) will be described with reference to FIG. 6.

The coating unit (COT) comprises: a processing container 200 having a wafer export and import opening 201; a shutter 202 for opening or closing the export and import opening 201; a spin chuck 203 for holding and rotating the wafer W; a cup 204 surrounding the spin chuck 203; a nozzle 205 which supplies a resist liquid; and a plurality of pins 206 which elevate the wafer W. The pins 206 are used for delivering the wafer W between the main transfer mechanisms 25A and 25B each and the spin chuck 203. An exhaust channel 207 and a drain channel 208 are provided on the bottom of the cup 204.

In such a coating unit (COT), a resist liquid is supplied from the nozzle 205 to the wafer W on the spin chuck 203. In addition, when the spin chuck 203 is rotated, a resist film is formed on the wafer W.

Figure 7A:
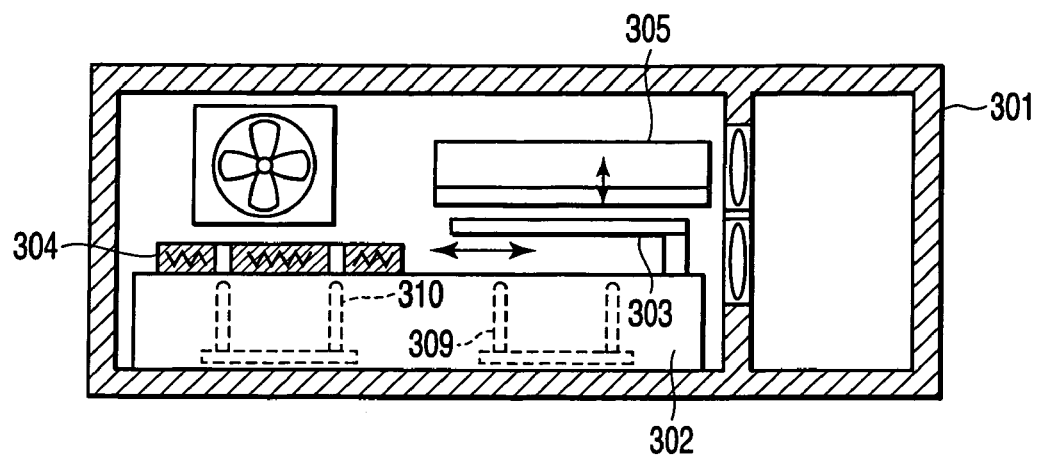
FIG. 7A is a longitudinal cross section showing a heating unit of the process section.
Figure 7B:
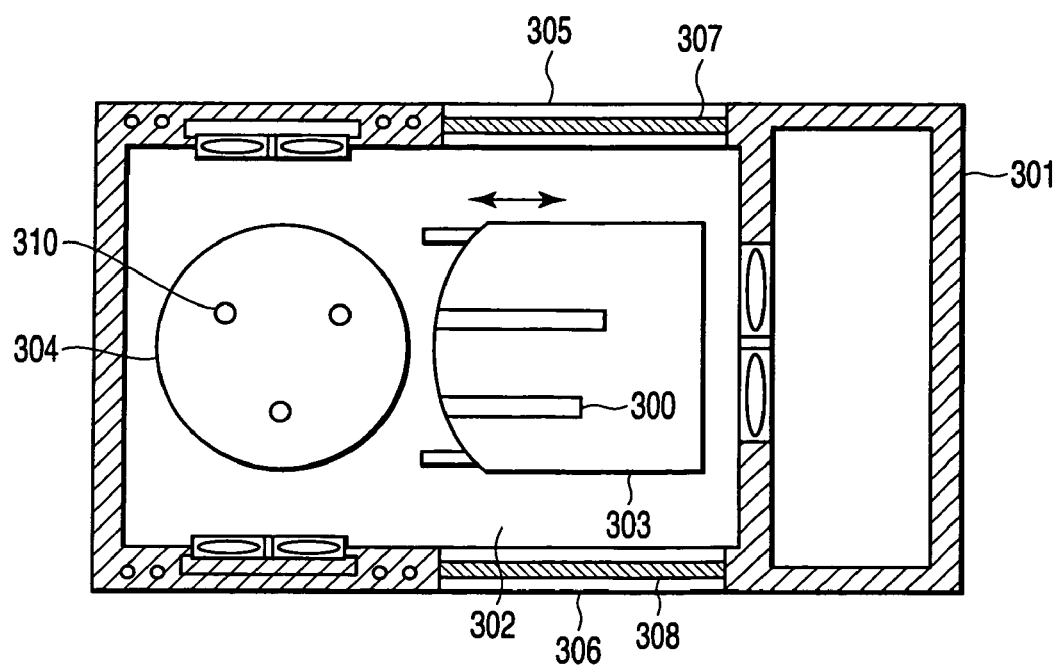
FIG. 7B is a plan view showing the heating unit of the process section.

Now, the heating units (PAB and PEB) will be described with reference to FIGS. 7A and 7B.

The heating units (PAB and PEB) each comprise: a housing 301; a stage 302; a cooling plate 303; a heating plate 304; wafer W export and import openings 305a and 306; shutters 307 and 308 and two sets of elevating pins 309 and 310 (three pins in each set). The cooling plate 303 is provide slidably above the stage 302, and a slit 300 is formed so as not to interfere with the elevating pins 310.

The heating units (PAB1 to PAB5) provided at the rack unit U2 can access the inside of the housing 301 from the main transfer mechanisms 25A and 25B, and the heating units (PEB1 to PEB5) provided at the rack unit U3 can access the inside of the housing 301 from the main transfer section 31A.

In such heating units (PAB and PEB), when the main transfer mechanism 25A (main transfer section 31A) advances via the import and export opening 305 (306), the wafer W on the main transfer mechanism 25A (main transfer section 31A) is delivered to the cooling plate 303 via the elevating pins 309. Then, the wafer W is delivered between the cooling plate 303 and the heating plate 304 by the movement of the cooling plate 303 and the elevation of the elevating pins 310. Subsequently, the wafer W heated by the heating plate 304 is delivered from the heating plate 304 to the cooling plate 303 again. After the wafer has been roughly cooled, the cooled wafer is received by the main transfer mechanism 25B, and is transferred to a next step.

Here, each module comprises: an opening for importing and exporting the wafer W; a shutter for opening or closing the opening; and elevating pins for delivering the wafer W between the transfer arm 23 and a transfer mechanism such as the main transfer mechanisms 25A and 25B in order to allocate the wafer W in the module.

Among the heating units, the bake unit (BAKE) or the post baking unit (POST) has a heating plate (not shown) for heating the wafer W to a predetermined temperature. In addition, the temperature control unit (CPL) has a temperature control plate (not shown) for temperature-controlling the wafer W at a predetermined temperature. Further, the temperature control units (CLP7 to CPL9) of the rack unit U3 and the delivery units (TRS5 and TRS6) can access both of the main transfer mechanism 25B and the main transfer section 31A in the same manner as the heating units (PEB1 to PEB5). Furthermore, the delivery unit (TRS) comprises a delivery base having elevating pins for carrying out wafer delivery and delivering the wafer W between the main transfer mechanisms 25A and 25B each and the main transfer section 31A.

Here, in the above-described coating and developing apparatus, the coating unit (CT), the developing unit (DEV), the reflection-proof film forming unit (BARC), the hydrophobic treatment unit (ADH), the heating units (BAKE, PAB, PEB, and LHP), the temperature control (CPL), the delivery unit (TRS), the edge exposure device (WEE) and the like correspond to a module group on which each wafer W is placed and the transfer sequence is determined. With respect to the module group, in accordance with the wafer transfer schedule described later, the transfer arm 23 and main transfer mechanism 25 (25A and 25B); and the second transfer means 31 take out one wafer W from the inside of the exported carrier C. After the wafer W of the immediately following module has been received, the preceding wafer W is delivered to the following module. Thus, for example, the wafers W are transferred to the immediately following module after started from the carrier C, thereby executing one transfer cycle. After the one transfer cycle has been executed, the process proceeds to the next transfer cycle. Then, by sequentially executing the transfer cycles, the wafers W are sequentially transferred from the lowest sequence module to the greater sequence module from the module group.

Here, a transfer route of the wafer W is determined by the wafer flow recipe prepared by the operator. Now, an example of the wafer flow recipe is shown here. The wafer W is taken out from the inside of the carrier C of the carrier placing section B1 by means of the transfer arm 23, and is transferred to the delivery unit TRS1. Next, the wafer is transferred by the main transfer mechanisms 25A and 25B in order of the temperature control unit (CPL), the reflection-proof film forming unit (BARC), the heating unit (BAKE), the temperature control unit (CPL), the coating unit (COT), the first heating unit (PAB), and the temperature control unit (CPL) of the rack unit U3. Further, by the second transfer means 31 (31A and 31B), the wafer W is transferred in order of the edge exposure device (WEE), the buffer cassette (SBU), and the temperature control unit (CPL), and the transferred wafer is then sent to the exposure system B4.

The wafer W is transferred to the second heating unit (PEB) of the process block B2 by the second transfer means 31 (31A and 31B) after exposure processing. Subsequently, the wafer W placed in the unit (PEB) is transferred by the main transfer mechanisms 25A and 25B in order of the temperature control unit (CPL), the developing unit (DEV), the heating unit (POST), and the temperature control unit (CPL). Then, the wafer W of the temperature control unit is returned to the carrier C of the carrier placing block B1 by means of the transfer arm 23 via the delivery unit (TRS) of the rack unit 1.

Here, after a resist liquid has been coated by the coating unit (COT), there are two transfer routes of the wafer W. First, after resist coating, the first main transfer mechanism 25A transfers the wafer W from the coating unit (COT) to the first heating unit (PAB) in the next step. Second, after resist coating, the main transfer mechanism 25A transfers the wafer W from the coating unit (COT) to the delivery unit (TRS), and further, the second main transfer mechanism 25B transfers the wafer W from the delivery unit (TRS) to the first heating unit (PAB). These transfer routes are selected according to the wafer flow recipe prepared by the operator.

Figure 8:
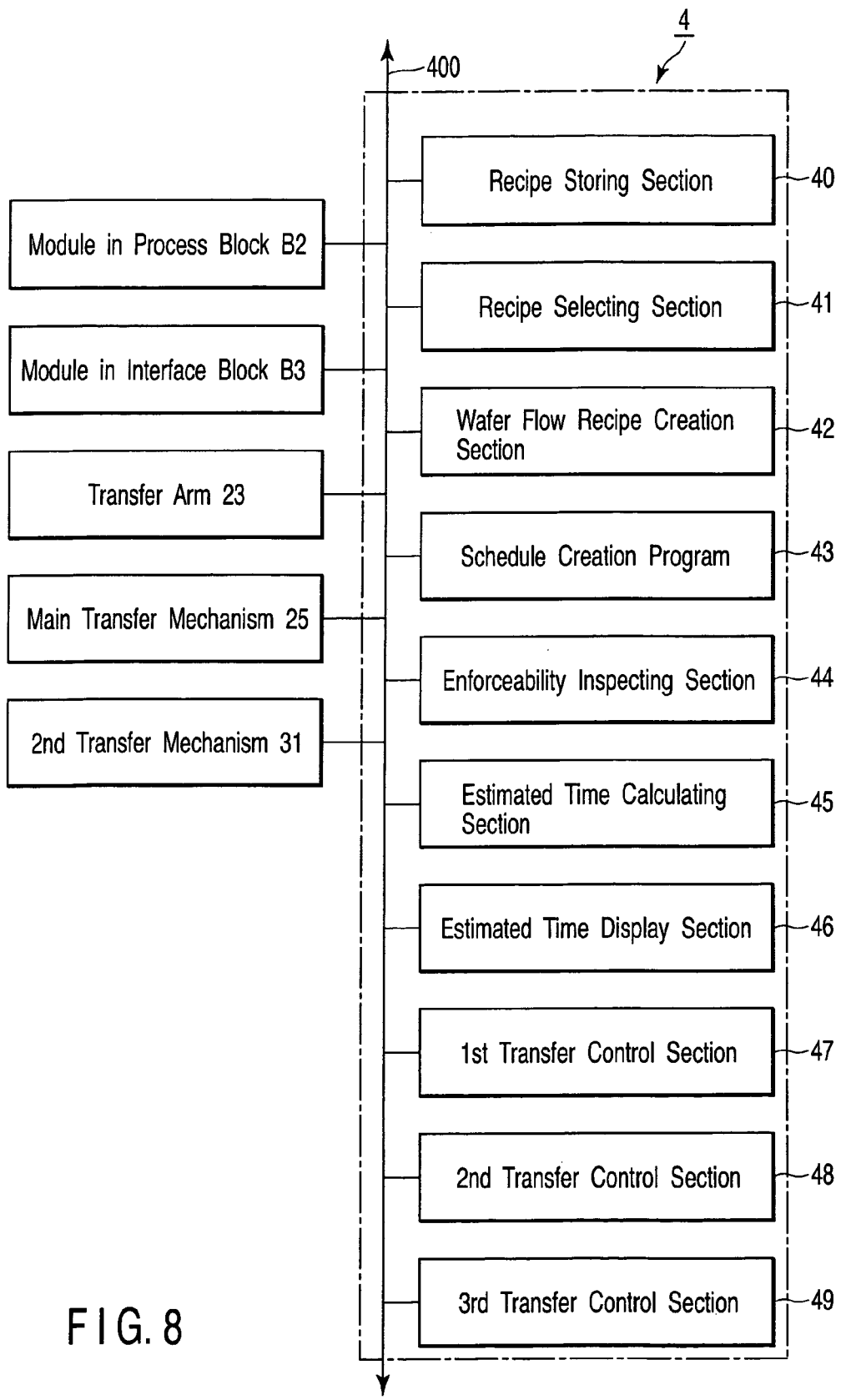
FIG. 8 is a control block diagram depicting the coating and developing apparatus according to the present invention.

Moreover, a resist pattern forming device comprises: a main transfer mechanism 25 (25A and 25B) and a control section 4 which makes a drive control of the second transfer means 31 (31A and 31B) or control of other modules. FIG. 8 shows a configuration of the control section 4. In actuality, the control section composed of a CPU (central processing unit), a program, and a memory. Here, a description will be given by way of block diagram depicting part of the constituent elements.

Reference numeral 400 shown in FIG. 8 denotes a system bus. To the system bus 400, there are connected: a recipe storage section 40; a recipe selecting section 41; a wafer flow recipe creation section 42; a schedule creation program 43; an enforceability inspecting section 44; an estimated time calculating section 45; an estimated time display section 46; a first transfer control section 47; a second transfer control section 48; and a third transfer control section 49, respectively.

The recipe storage section 40 stores a wafer flow recipe, a wafer transfer schedule, a process recipe, and a recipe having recorded therein data such as a time of processing or transfer carried out in each module. The wafer flow recipe is provided as data obtained by recording the transfer route of the wafer W, for example. Based on this wafer flow recipe, a wafer transfer schedule whose contents indicate at which timing or to which module to transfer all the wafers W in the same lot is determined. The wafer transfer schedule is provided data obtained by sequentially allocating the wafers W, for example, and arranging transfer cycle data obtained by specifying a transfer cycle in association with the sequence of the wafers W and each module. The process recipe is provided as data obtained by recording a condition or the like for processing carried out for the wafers W.

The recipe selecting section 41 is provided as means for the operator to select a proper recipe from among the recipes stored in the recipe storage section 40. For example, the user can input the number of wafers processed, resist type and the like.

The wafer flow recipe creation section 42 is provided as means for the operator to prepare a new wafer flow recipe. The schedule creation program 43 is provided as means for automatically preparing a wafer transfer schedule in accordance with the input wafer flow recipe. The enforceability inspecting section 44 is provide as means for inspecting enforceability of the prepared wafer flow recipe. The estimated time calculating section 45 is provided as means for predicting and calculating one or two of the PCD time, PAD time, and PED time with respect to the enforceable transfer schedule. The estimated time display section 46 is provided as means for displaying the predicted and calculated PCD time or the like. The wafer flow recipe and the wafer transfer schedule are stored in the recipe storage section 40.

The first to third transfer control sections 47, 48, and 49 control the transfer arm 23, the main transfer mechanism 25 (25A and 25B) and the second transfer means 31 so that the wafer W is transferred to the corresponding module with reference to the wafer transfer schedule. The transfer cycle is executed by the first to third transfer control sections 47, 48, and 49.

Now, estimation and calculation of the PCD time will be described with reference to FIGS. 9A, 9B, 10 and 11.

The "PCD time (first time)" is referred to as a time interval from a time point at which a coating process of a resist liquid has been terminated at the coating unit (COT)" to a time point at which a first heating process (pre-baking process) is started at the first heating unit (PAB) in a next step. The "time point at which the coating process is terminated" used here is referred to as a timing with which the coating process in the coating unit (COT) terminates and the wafer W waits for the wafer to be lifted on the spin chuck 203 by the elevating pins 206. The "time point at which the first heating process is started" used here is referred to as a timing with which the wafer W is delivered onto the cooling plate 303 of the heating unit (PAB) and the shutters 307 and 308 of the housing 301 are closed.

Figure 10:
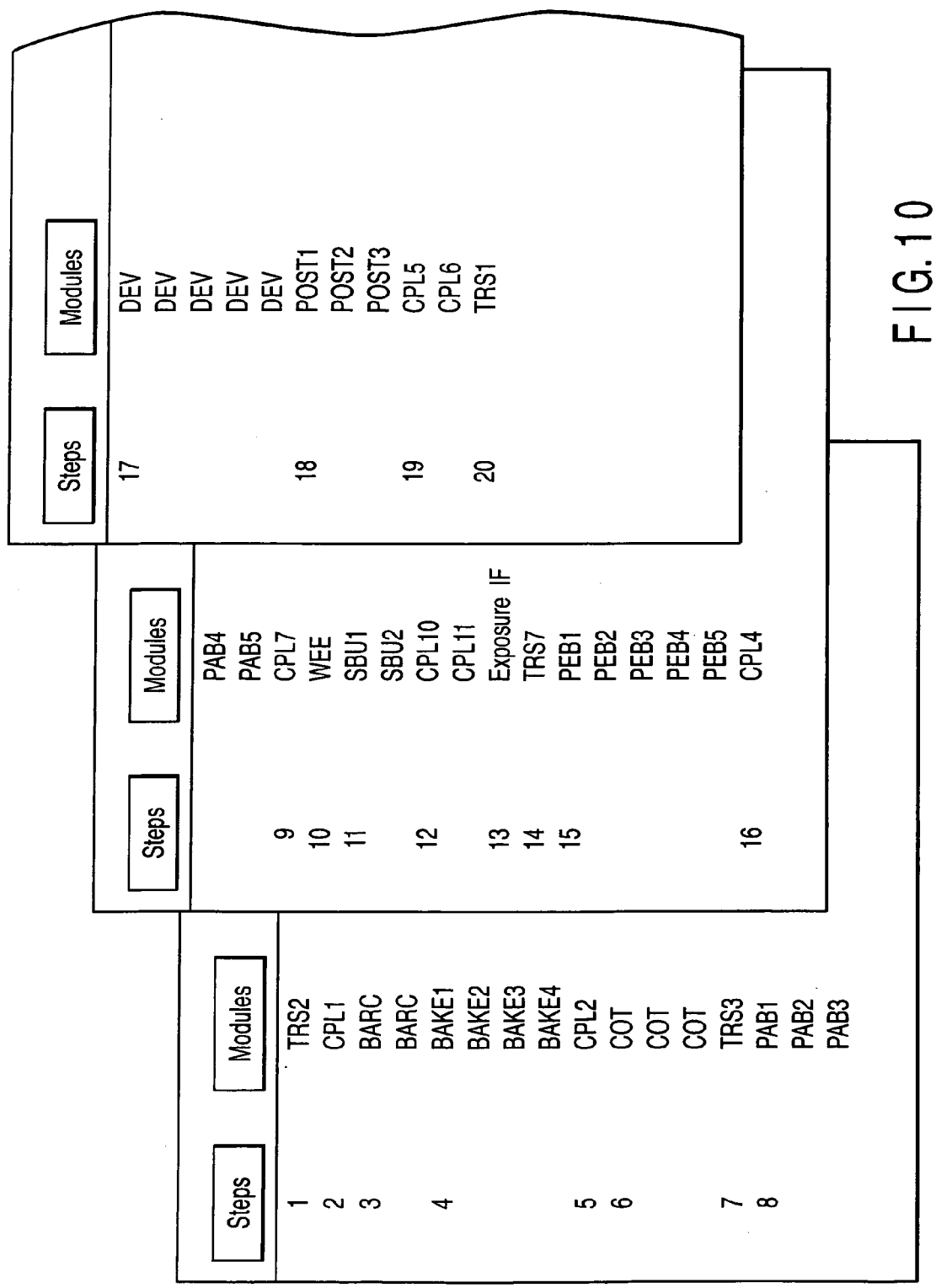
FIG. 10 is a view showing an example of a screen for producing a wafer flow recipe.

Now, a description will be given with respect to a series of procedures when all the wafers W in the same lot are continuously processed. First, prior to starting a process for the wafer W, an operator creates a wafer flow recipe (step S11). The operator uses a wafer flow recipe creation screen, thereby selecting a module to be used from he modules mounted on the coating and developing apparatus on the screen, and then, inputting the number of the selected modules in order of use. For example, as shown in FIG. 10, items of data are sequentially input for the delivery unit (TRS2) in step 1, the temperature control unit (CPL1) in step 2, and two reflection-proof film forming units (BARC) in step 3, thereby create a wafer flow recipe.

The thus prepared wafer flow recipe is stored in the recipe storage section 40 after inspected at the enforceability inspecting section 44. The enforce-ability inspecting section 44 references the recipe having recorded therein a time of processing or transfer carried out at each module to inspect the enforceability (step S12). In the case where enforcement is impossible, the fact is displayed on, for example, the wafer flow recipe creation screen. Then, the operator prepares the wafer flow recipe again, and changes types, number, and sequence of modules to be used, for example. In the case where enforcement is possible, on the other hand, the estimated time calculating section 45 estimates the PCD time or the like (step S13), and a wafer flow recipe information screen, for example displays a result of the calculation (step S14). When the estimation displayed PCD time is within a preset time interval, for example, it is recognized that the wafer flow recipe has been determined by the operator, and is stored in the recipe storage section 40. In this manner, a recipe creation work terminates. On the other hand, when the creation displayed PCD time or the like is out of the preset time interval, the operator creates the wafer flow recipe again, and changes types, number, and sequence of modules to be used.

Figure 9A:
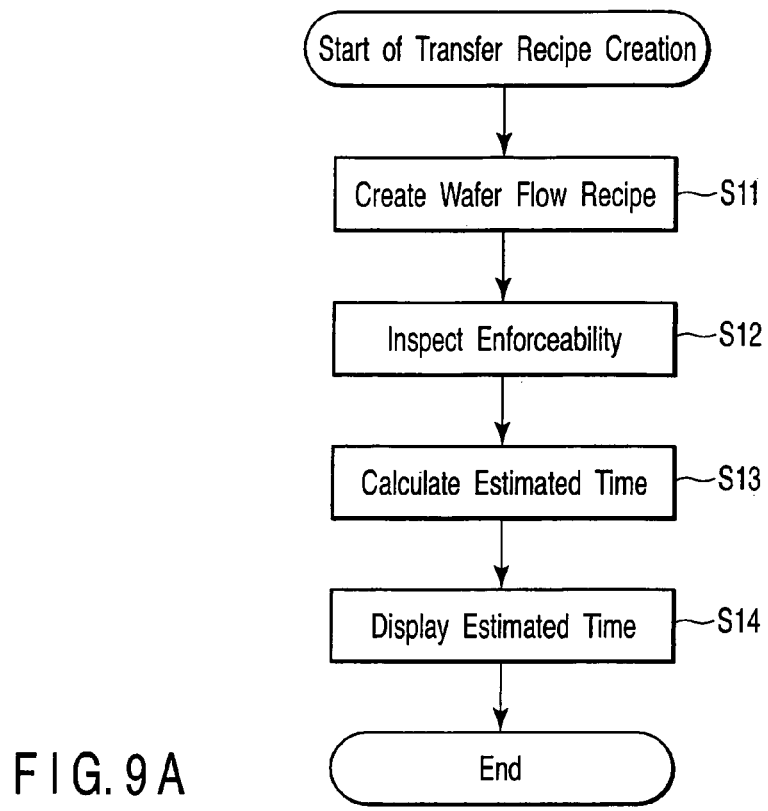
FIG. 9A is a process chart showing procedures for a coating and developing process onto a substrate.
Figure 9B:
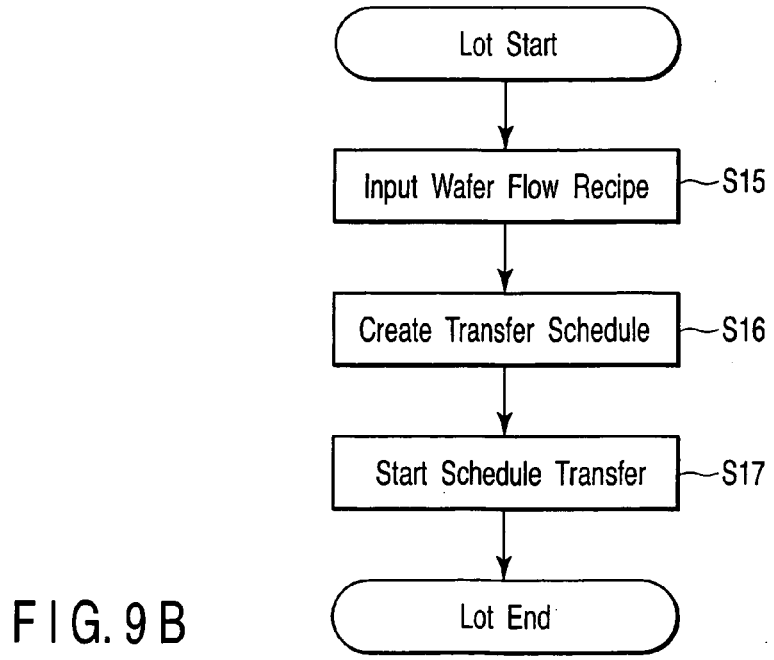
FIG. 9B is a process chart showing procedures for a wafer transfer schedule of the substrate.

As shown in FIG. 9B, when lot processing is started, the operator reads the specified wafer flow recipe (step S15). Based on the read wafer flow recipe, a wafer transfer schedule is automatically prepared by the schedule creation program 43 (step S16). Operations of the transfer arm 23, the main transfer mechanism 25 (25A and 25B), and the second transfer means 31 (31A and 31B) each are controlled based on the created wafer transfer schedule, and the scheduled transfer of the wafers W is started (step S17). When the scheduled transfer of all the wafers W in a lot completes, lot processing is terminated.

Figure 11:
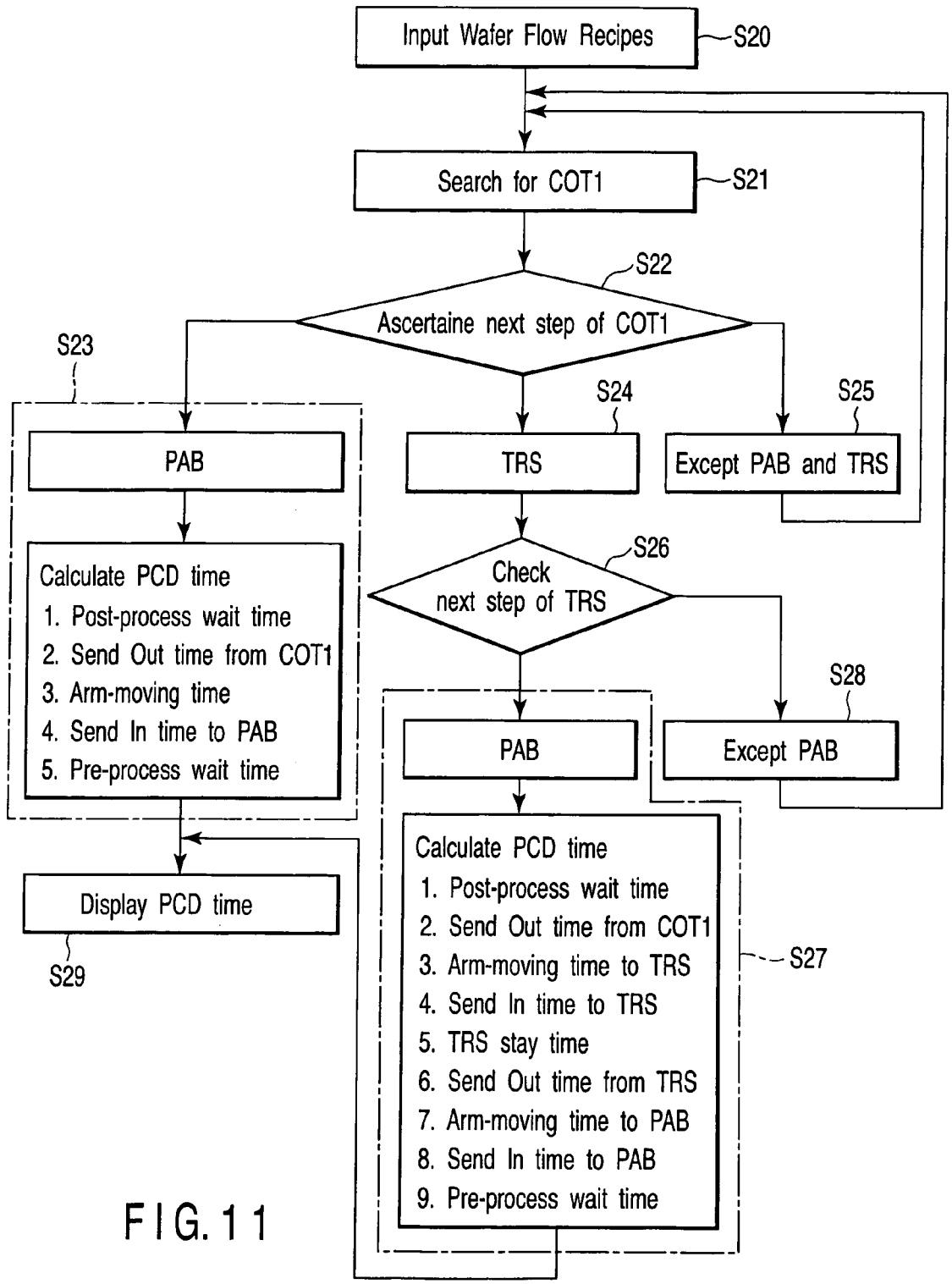
FIG. 11 is a process chart showing procedures when a PCD time is estimated and calculated.

Now, procedures for calculating the PCD time will be specifically described with reference to FIG. 11. First, a specified wafer flow recipe is read (step S20); coating units (COT) are searched sequentially in ascending order from step 1 in accordance with the steps for the wafer flow recipe shown in FIG. 10; and the first found coating unit (COT) is defined as the first coating unit (COT1) (step S21). Next, it is checked whether the step in a next session of the first coating unit (COT1) is the first heating unit (PAB), the delivery unit (TRS), or a module other than the first heating unit (PAB) and the delivery unit (TRS) (step S22). When a module targeted to transfer the wafer W is the first heating unit (PAB), processing goes to step S23. When a module targeted for transfer is the delivery unit (TRS), processing goes to step S24. When a module targeted for transfer is another module, processing goes to step S25.

In the case where processing goes to step S24, it is further checked whether the step of a next session of the delivery unit (TRS) is the first heating unit (PAB) or a module other than the first heating unit (PAB) (step S26). When a module targeted for transfer is the first heating unit (PAB), processing goes to step S27. When a module targeted for transfer is another module, processing goes to step S28.

Figure 12:
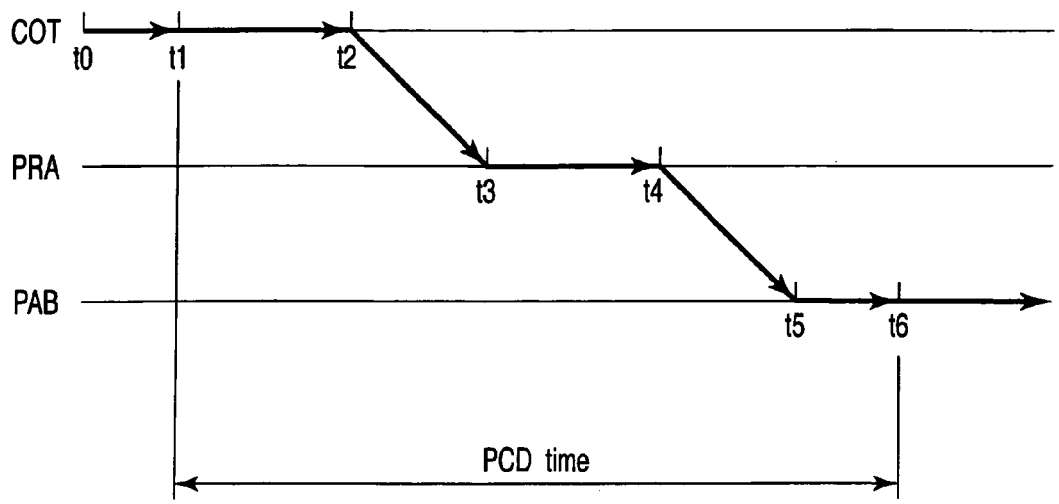
FIG. 12 is a timing chart showing a flow of a substrate in a PAB direct transfer.

In the case where processing goes to step S23, the PCD time is calculated in accordance with the following procedures. PCT times t1 to t6 are calculated by totalizing the times of the following items 1 to 5. Now, the PCD times t1 to t6 will be described with reference to the following items 1 to 5 and FIG. 12 together.

1. Post waiting time t1 to t2 of coating unit (COT1): This time is defined as a time interval from a time point t1 at which processing in the coating unit (COT1) has been terminated to a time point t2 at which the wafer W1 is exported from the unit (COT1). In the case where a cycle time control occurs, the associated set time is defined as a post waiting time. In the case where no cycle time control occurs, the post waiting time is defined as 0 seconds. The "cycle time control" used here denotes that all the wafer transfer times between modules are made identical to each other.

2. Export time t2 to t3 of wafer W1 from coating unit (COT1): This time is obtained by integrating the following six times, and is totally calculated by using a design time.

Open time of the shutter 202 of the coating unit (CPT1)

Time at which one arm of the main transfer mechanisms 25A and 25B is advanced into the coating unit (CPT1)

Time at which the wafer W1 in the coating unit (COT) is lifted by the elevating pins 206

Time at which the wafer W1 in the coating unit (COT1) is held and retracted by one arm of the main transfer mechanisms 25A and 25B, thereby exporting the wafer W1 from the inside of the coating unit (COT1), and at the same time, advancing the other arm holding a wafer W2

Time at which the wafer W2 on the other arm is placed on the elevating pins 206

Time at which the other arm is retracted from the inside of the coating unit (COT1)

3. Transfer time (design value) t3 to t4 of transfer mechanism: This time is defined as a time interval for the main transfer mechanisms 25A and 25B to transfer from the coating unit (COT1) to the first heating unit (PAB).

4. Time (design value) t4 to t5 of importing wafer W1 to heating unit (PAB): This time is obtained by integrating the following five times, and totally calculated by using a design time.

Open time of the shutter 307 (308) of the heating unit (PAB)

Time at which one arm holding the wafer W1 of the main transfer mechanisms 25A and 25B is advanced into the heating unit (PAB)

Time at which the wafer W1 on the one arm is placed on the cooling plate 303 of the heating unit (PAB)

Time at which the one arm is retracted from the heating unit (PAB)

Post-process preparation operating time

5. Pre-waiting time t5 to t6 of heating unit (PAB): This time is defined as a time interval from a time point t5 at which the wafer W1 is imported into the heating unit (PAB) to a time point t6 at which processing is started at the heating unit (PAB). In the case where a cycle time control occurs, the associated set time is defined as a pre-waiting time. In the case where no cycle time control occurs, the pre-waiting time is defined as 0 seconds.

Figure 13:
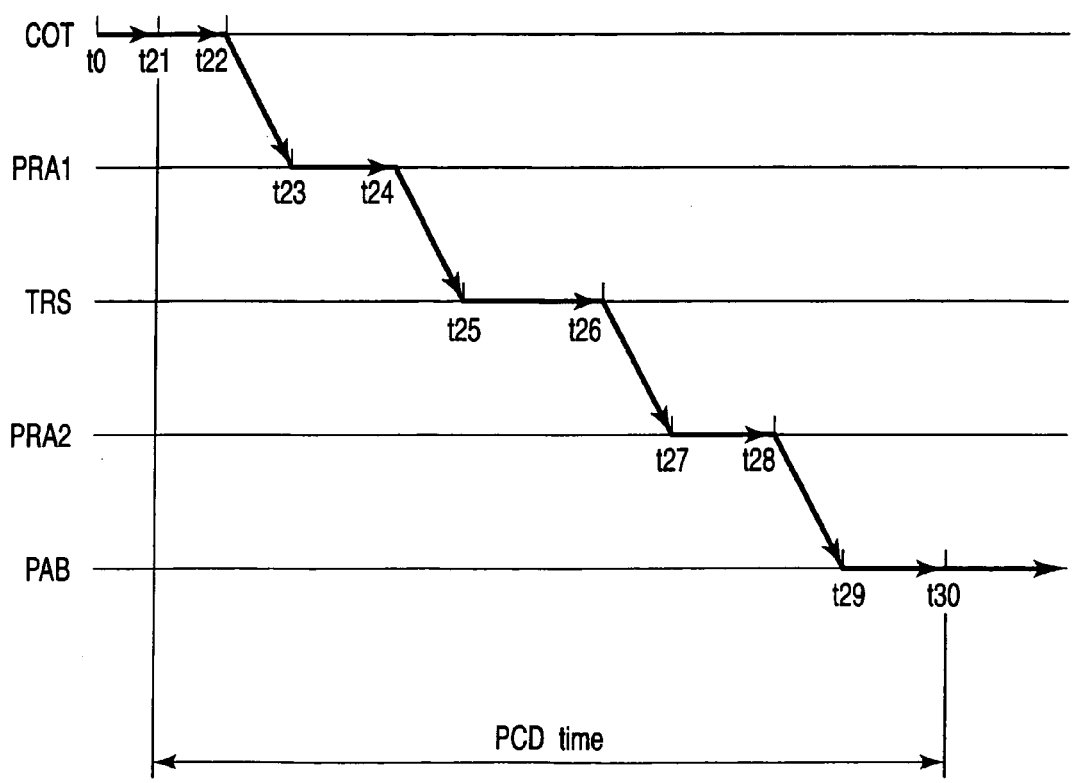
FIG. 13 is a timing chart showing a flow of a substrate in a transfer via TRS.

In the case where a next step of the first coating unit (COT1) is the delivery unit (TRS), and the next step of the delivery unit (TRS) is the heating unit (PAB), the PCD time is calculated in step S27. PCD time t21 to t30 is calculated by totalizing the times of the following items 1 to 9. The PCD time t21 to t30 will be described with reference to the following items 1 to 9 and FIG. 13 together.

1. Post-waiting time t21 to t22 of coating unit (COT1): This time is defined as a time interval from a time point t21 at which process in the coating unit (COT1) has been terminated to a time point t22 at which the wafer W1 is exported from the unit (COT1). In the case where a cycle time control occurs, the associated set time is defined as a post-waiting time. In the case where no cycle time control occurs, the post-waiting time is defined as 0 seconds.

2. Export time t22 to t23 of wafer W1 from coating unit (COT1): This time is obtained by integrating the following six times, and totally calculated by using a design time.

Open time of the shutter 202 of the coating unit (COT1)

Time at which one arm of the main transfer mechanism (PRAL) is advanced into the coating unit (COT1)

Time at which the wafer W1 in the coating unit (COT1) is lifted by the elevating pins 206

Time at which the wafer W1 is held by one arm of the main transfer mechanism (PRA1), and is retracted from the inside of the coating unit (COT1), and at the same time, the other arm holding the wafer W2 is advanced Time at which the wafer 2 on the other arm is placed on the elevating pins 206;

3. Transfer time (design value) t23 to t24 of transfer mechanism: This time is defined as a time interval for the main transfer mechanism (PRAL) to move the first coating unit (COT1) to the delivery unit (TRS)

4. Time (design value) t24 to t25 of importing wafer W1 to delivery unit (TRS): This time is obtained by integrating the following four times, and is totally calculated by using a design time.

Open time of the shutter of the delivery unit (TRS)

Time at which one arm holding the wafer W1 on the main transfer mechanism (PRA1) is advanced into the delivery unit (TRS)

Time at which the wafer W1 on the one arm is placed on a delivery base on the delivery unit (TRS)

Time at which the one arm is retracted from the inside of the delivery unit (TRS)

5. Stay time t25 to 526 in delivery unit (TRS): This time is calculated by calculating a stay time (cycle time)—AOT. The "cycle time" used here is referred to as a cycle time of the resist pattern forming device. In addition, the "AOT" used here is referred to as a transfer time of the wafer W from the coating unit (COT1) to the delivery unit (TRS). The AOT is obtained by integrating the following five times.

Time (design value) of exporting the wafer W1 from a module of the previous process of the coating unit (COT1)

Move time (design value) of the main transfer mechanism (PRA1) from the module in the previous process to the coating unit (COT1)

Wafer replacement time (design value) in the coating unit (COT1)

Move time (design value) of the main transfer mechanism (PRA1) from the coating unit (COT1) to the delivery unit (TRS) in the next session Import time (design value) of the wafer W1 to the delivery unit (TRS)

6. Export time (design value) t26 to t27 of the wafer W1 from the delivery unit (TRS): This time is obtained by integrating the following four times, and is totally calculated by a design time.

Open time of the shutter of the delivery unit (TRS)

Time at which one arm of the main transfer mechanism (PRA2) is advanced into the delivery unit (TRS)

Time at which the elevating pins of the delivery unit (TRS) are elevate to lift the wafer W1

Time at which the wafer 1 is held by the one arm, and is retracted from the inside of the delivery unit (TRS)

7. Move time (design time) t27 to t28 of transfer mechanism: This time is defined as a time interval for the main transfer mechanism (PRA2) to move from the delivery unit (TRS) to the heating unit (PAB)

8. Time t28 to t29 of importing wafer into the heating unit (PAB): This time is obtained by integrating the following seven times, and is totally calculated by a design time.

Open time of the shutter of the heating unit (PAB)

Time at which the other arm which does not hold the wafer of the main transfer mechanism (PRA2) is advanced into the heating unit (PAB)

Time of lifting the wafer W2 in the heating unit (PAB)

Time at which the wafer W2 is received by the other arm, the arm is retracted, and at the same time, the one arm holding the wafer 1 is advanced Time at which the wafer W1 on the one arm is placed on the cooling plate 303 of the heating unit (PAB)

Time at which the one arm is retracted from the inside of the heating unit (PAB)

Pre-process preparation operating time

9. Pre-waiting time t29 to t30 of heating unit (PAB): This time is defined as a time interval from a time point t29 at which the wafer W1 is imported into heating unit (PAB) to a time point t30 at which processing is started at the heating unit (PAB). In the case where a cycle time control occurs, the associated set time is defined as a pre-waiting time. In the case where no cycle time control occurs, the pre-waiting time is defined as 0 seconds.

Here, in the wafer flow recipe shown in FIG. 10 described above, wafers W are produced to be transferred in route of the delivery unit (TRS2), the temperature control unit (CPL1), the reflection-proof film forming unit (BARC), the heating units (BAKE1 to BAKE4), the temperature control unit (CPL2), the coating unit (COT), the delivery unit (TRS3), the heating unit (PAB1 to PAB5), the temperature control unit of the rack unit U3 (CPL7), the edge exposure device (WEE), the buffer cassettes (SBU1 and SUB2), the temperature control units (CPL 10 and CPL 11), the IN stage 34 of the exposure device B4, the OUT stage 35, the delivery unit (TRS7), the heating units (PHB1 to PHB5), the temperature control unit (CPL4), the developing unit (DEV), the heating units (POST1 to POST3), the temperature control unit (CPL5 and CPL6), and the delivery unit (TRS1).

The PCD time predicted and calculated by the above wafer flow recipe is calculated by totalizing the times of the following items 1 to 9.

1. Post-waiting time t21 to t22 of the coating unit (COT1): 0 seconds (a case where no cycle time control occurs is presumed)

2. Export time t22 to t23 of the wafer W1 from the coating unit (COT1): 2.5 seconds 3. Move time t23 to t24 of the main transfer mechanism (PRA1) from the coating unit (COT1) to the delivery unit (TRS): 1.0 second 4. Import time t24 to t25 of the wafer W1 to the delivery unit (TRS): 1.5 seconds 5. Stay time t25 to t26 at the delivery unit (TRS): "Stay time=(cycle time)−(AOT)=30.5−[AOT=(2.5+35+25)]=22.0 seconds 6. Export time t26 to t27 of the wafer W1 from the delivery unit (TRS): 1.5 seconds 7. Move time t27 to t28 of the transfer arm from the delivery unit (TRS) to the heating unit (PAB) in the next session: 1.0 second 8. Import time t28 to t29 of the wafer W1 to the heating unit (PAB): 3.5 seconds 9. Pre-waiting time t29 to t30 of the heating unit (PAB): 0 seconds (a case where no cycle time control occurs is presumed)

Therefore, the PCD time t21 to t30 is produced as 33 seconds (0+2.5+1.0+1,5+22.0+1.5+1.0+3.5+0).

The thus calculated PCD time, for example, as shown in FIG. 14, is displayed on the wafer flow recipe information screen (step S29). FIG. 14 shows an example of displaying on the same screen: a cycle time of the resist pattern forming device (defined as a first cycle time in the figure); a cycle time of the coating and developing apparatus (defined as a second cycle time in the figure); a cycle time of the exposure device B4 (defined as a third cycle time in the figure); a PCD time; a PAD time; and a PED time. The cycle time used here is defined as a time interval required when one wafer W is transferred to all modules in each device, the wafer W being calculated with reference to the wafer flow recipe and process recipe, and a series of processes are carried out. Therefore, in the case where the second cycle time is rate-determining, the first cycle time is produced as the same value as the second cycle time. In the case where the third cycle time is rate-determining, the first cycle time is produced as the same value as the third cycle time.

A circuit pattern line width or a film quality state can be predicted by predicting and calculating the PCD time in this manner. Namely, after resist coating, while a pre-bake process is carried out by using the heating unit (PAB), the chemical in the resist film on the wafer W reacts with an amine or the like in equipment atmosphere. In this manner, the film quality of the resist film changes or this change of film quality affects the line width. In addition, the solvent in the resist film on the wafer W evaporates, and the velocity of this evaporation phenomenon affects the circuit line width. There is a correlation between the PCD time from the completion of resist coating to carrying out a pre-bake process and the circuit line width or film quality. Therefore, a degree of influence on a process such as circuit line width or film quality can be predicted by predicting and calculating the PCD time.

Now, the PAD time will be described here.

The "PAD time (second time)" used here is defined as a time interval from a time point at which a pre-base process has been terminated at the heating unit (PAB) to a time point at which an exposure process is started by the exposure device. The "time point at which a pre-base process has been terminated" used here is defined as a time at which the wafer W is delivered from the heating unit (PAB) to the main transfer mechanism (PRA), and the shutter of the heating unit (PAB) is closed. The "time point at which an exposure process is started" used here is defined as a time at which the wafer W before exposed is placed in the IN stage 34 of the exposure device B4.

The PAD time is calculated by totaling the times of the following procedures 1 to 4

1: A total time equal to or shorter than a total time of time intervals (design values) of water exporting and importing operations of a module passing from the heating unit (PAB) to the IN stage 34 of the exposure device B4

Replacing operation time A of the heating unit (PAB)

Operation time for importing the wafer to the temperature control unit (CPL7)

Operation time for exporting the wafer from the temperature control unit (CPL7)

Replacing operation time of the edge exposure device (WEE)

Operation time for importing the wafer into the temperature control units (CPL10 and CPL11)

Operation time for exporting the wafer from the temperature control unit (CPL10 and CPL11)

Operation time for importing the wafer to the exposure device B4

2: A total time equal to or shorter than a total time of move times (design values) of inter-module transfer means passing from the heating unit (PAB) to the exposure device B4

Move time from the heating unit (PAB) to the temperature control unit (CPL7)

Move time from the temperature control unit (CPL7) to the edge exposure device (WEE)

Move time from the edge exposure device (WEE) to the temperature control units (CPL10 and CPL 11)

Move time from the temperature control units (CPL10 and CPL11) to the exposure device 3: A total time of a process time in the temperature control unit (CPL7), edge exposure device (WEE), and temperature control units (CPL10 and CPL11) and an overhead time of the edge exposure device (WEE)

4: An arm move delay time is considered at the time of wafer transfer by the main transfer section 31A and auxiliary transfer section 31B from the temperature control unit (CPL7) to the exposure device B4

Maximum move delay time of the main transfer section 31A

Maximum move delay time of the auxiliary transfer section 31B

A time totalizing the above time intervals is produced as the PAD time. However, the wafer W is made standby in a buffer cassette (SBU) in order to absorb a difference in cycle time between the exposure device B4 and the coating and developing apparatus. Thus, the associated stay time is obtained according to the exposure device B4, and this obtained time must also be included in calculation.

Specifically, the PAD time is obtained by integrating the times of the following items 1 to 4.

1. A delay time interval from establishment of a state in which the wafer W can be exported from the heating unit (PAB) until the wafer W is actually exported by the main transfer mechanism (PRA2) 25B: 11.0 seconds This time is calculated by totalizing the following seven design values.

Replacing operation time of pre-baking

Operation time for importing the wafer W to the temperature control unit (CPL)

Operation time for exporting the wafer W from the temperature control unit (CPL)

Replacing operation time of the edge exposure device (WEE)

Operation time for importing the wafer W to the high precision temperature control unit (CPL10)

Operation time for exporting the wafer W from the high precision temperature control unit (CPL10)

Operation time for importing the wafer W to an exposure mechanism interface (EIF)

2. A total time of arm move time intervals between modules passing from the heating unit (PAB) to the IN stage 34 of the exposure device B4: 10.1 seconds This time is calculated by totalizing the following four design values.

Move time from the heating time (PAB) to the temperature control unit (CPL)

Move time from the temperature control unit (CPL) to the edge exposure device (WEE)

Move time from the edge exposure device (WEE) to the high precision temperature control unit (CPL10)

Move time from the high precision temperature control unit (CPL10) to the IN stage 34

3. A total process time in the temperature control unit (CPU), edge exposure device (WEE), and high precision temperature control unit (CPL10): 5.7 seconds This time is calculated by totalizing the following three recipe specifying time and one design value.

Process time (recipe specifying time) of the temperature control unit (CPL)

Process time (recipe specifying time) of the edge exposure device (WEE)

Process time (recipe specifying time) of the high precision temperature control unit (CPL10)

Process overhead time (design value) of the edge exposure device (WEE)

4. Arm move delay time from the temperature control unit (CPL) to the exposure mechanism interface (EIF): 18.8 seconds Maximum arm move delay time of the main transfer section (IRAM) 31A: 11.8 seconds Maximum arm move delay time of the auxiliary transfer section (IRAS) 31B: 7.0 seconds Therefore, a maximum value of the PAD time is 45.6 seconds (=11.0+10.1+5.7+18.8).

This PAD time also has a degree of process influence, and thus, affects the circuit line width or film quality state. There is a correlation between the PAD time and the circuit line width or film quality. In this manner, the degree of influence on a process such as the circuit line width or film quality state can be predicted by calculating the PAD time.

Now, procedures for calculating the PED Tim will be described with reference to FIG. 15.

The "PED time (third time)" used here is referred to as a time interval from a time point at which an exposure process in the exposure device B4 has been terminated to a time point at which a second heating process (post exposure baking process) is started by the heating unit (PEB) in a next session. The "time point at which an exposure process has been terminated" used here is referred to as a time at which the wafer W after exposed is placed in the OUT stage 35 of the exposure device B4. The "time point at which a second heating process is started" used here is referred to as a time at which the wafer W is delivered onto the cooling plate 303 of the second heating unit (PEB), and the shutters 307 and 308 of the housing 301 are closed. In this case as well, a specified wafer flow recipe is read (step S31), and the PED Tim is calculated in accordance with this wafer flow recipe (step S32).

In the wafer flow recipe shown in FIG. 10, the wafer W is transferred in route of the OUT stage 35 of the exposure device, the auxiliary transfer section 31B, the delivery unit TRS7, the main transfer section 31A, and the second heating unit (PEB). A maximum time and a minimum time of the PED time in this case are calculated.

The maximum value of the PED time is obtained by integrating the times of the following items 1 to 4.

1. A delay time from establishment of a state in which the wafer W1 can be exported from the exposure device B4 until the wafer W is actually exported by the auxiliary transfer section 31B (first delay time). This delay time is referred to as a time interval at which the auxiliary transfer section 31B is waited when an attempt is made to transfer another wafer (for example, transfer of the wafer W2 from the temperature control unit (CPL10) to the IN stage 34 of the exposure device B4) at the time when a state has been established such that the wafer W1 can be exported from the OUT stage 35 of the exposure device B4. This delay time is calculated by a total time of the next design values.

Move time (design value) of the auxiliary transfer section 31B from the exposure device B4 to the temperature control unit (CPL10)

Time of exporting the wafer W2 into the temperature control unit (CPL10) by the auxiliary transfer section 31B Move time (design value) of the auxiliary transfer section 31B from the temperature control unit (CPL10) to the exposure device B4

Time (design value) of importing the wafer W2 to the exposure device B4 by the auxiliary transfer section 31B 2. A time interval from exporting the wafer W1 from the exposure device B4 to completion of importing the wafer to the delivery unit (TRS7): This time is produced as a design value of a time interval required for transfer of the wafer W1 from the OUT stage 35 of the exposure device B4 to the wafer W1. The same operation is carried out in the session of item 1, and thus, the time is also equal thereto.

3. A delay time (second delay time) from establishment of a state in which the wafer W1 can be exported from the delivery unit (TRS7) until the wafer is actually exported by the main transfer section 31A (second delay time): This time is referred to as a time interval at which the main transfer section 31A is waited when an attempt is made to transfer another wafer at the time when the wafer W1 can be exported from the delivery unit (TRS37). This time corresponds to a required time interval for the main transfer section 31A to transfer another wafer.

The other transfer patterns include the following patterns (a) to (e).

(a) Delivery unit (TRS7)→Edge exposure device (WEE)→Buffer cassettes (SBU1 and SBU2)

(b) Delivery unit (TRS7)→Edge exposure device (WEE)

(c) Edge exposure device (WEE)→Buffer cassette (SBU1 and SBU2)

(d) Delivery unit (TRS7)→Buffer cassettes (SBU1 and SBU2)

(e) Buffer cassette (SBU1 and SBU2)→Temperature control unit (CPL10 and CPL11)

Among these patterns, transfer in pattern (a) requires the longest time interval, and this time interval is produced as a second delay time. This delay time is also calculated from a design value, and a time totalizing the following time intervals is produced.

Move time of the main transfer section 31A from a point which is the most distant from the delivery unit (TRS7) to the delivery unit (TRS7)

Time of exporting the wafer W2 from the delivery unit (TRS7) to the main transfer section 31A Move time of the main transfer section 31A from the delivery unit (TRS7) to the edge exposure device (WEE)

Time of importing the wafer W2 of the main transfer section 31A to the edge exposure device (WEE)

Time of exporting the wafer W2 of the main transfer section 31A from the edge exposure device (WEE)

Move time of the main transfer section 31A from the edge exposure device (WEE) to the buffer cassettes (SBU1 and SBU2)

4. A time from exporting the wafer W1 from the delivery unit (TRS7) to completion of importing the wafer to the second heating unit (PEB): This time is referred to as a time interval required for transfer from the delivery unit (TRS7) to the heating unit (PEB), and is produced as a total time of the following times (design values).

Move time of the main transfer section 31A from a point which is the most distant from the delivery unit (TRS7) to the delivery unit (TRS7)

Time of exporting the wafer W1 from the delivery unit (TRS7) to the main transfer section 31A Move time of the main transfer section 31A from the delivery unit (TRS7) to the heating unit (PEB)

Time of importing the wafer W1 from the main transfer section 31A to the heating unit (PEB)

From the foregoing description, in the above-described case, the total time of the above times 1 to 4 is calculated as a maximum prediction time.

1. Design value of first delay time=7.0 seconds
2. Design value of time interval from exporting the wafer W from the exposure device B4 to completion of importing the wafer to the delivery unit (TRS7)=7.0 seconds
3. Design value of second delay time=11.8 seconds
4. Design value of time interval required for the completion of importing the wafer to the heating unit (PEB)=6.0 seconds.

Therefore, the maximum value of the PED time is 31.8 seconds (=7.0+7.0+11.8+6.0).

With respect to the minimum time of the PED time, on the other hand, the first delay time and the second delay time do not occur occasionally. Thus, the time interval required for the completion of importing the wafer to the delivery unit (TRS7) and the time interval required for the completion of importing the wafer to the heating unit (PEB) may be considered. From the design value described previously, the minimum time of the PED time is produced as 7.0+6.0=13.0 seconds. The maximum time and the minimum time of the thus calculated PED time are displayed on, for example, the wafer flow recipe information screen shown in FIG. 14 (step S33).

In this manner, it is preferable that the PED time be displayed in consideration of the maximum time and the minimum time. This is because a difference in PED time is more closely associated with that in circuit line width as compared with the PCD time or PAD time, and, if the PED time deviates within the range of, for example, ±2 seconds, the circuit line width also deviates within the range of, for example, ±10 nm, which is out of an allowable range.

Therefore, a difference in circuit line width in this case can be grasped by displaying the maximum time and the minimum time of the PED time. Countermeasures can be taken, for example, by tolerating this difference, namely, by adjusting a transfer time from the exposure device B4 to the heating unit (PEB) to reduce the degree of the difference even if throughput is lowered.

As has been described above, according to the present embodiment, the PCD time or PED time is displayed by estimating and calculating it at the time when the operator has prepared the wafer flow recipe. Thus, the PCD time or the like can grasped without actually supplying the product wafer on test wafer W to the resist pattern forming device, and the PCD time or the like can be estimated with high work efficiency without any problem or requiring a time. Further, when the estimated and calculated PCD time or the like is not within the set range, the operator may correct the wafer flow recipe on the computer screen again. Therefore, the creation of the wafer flow recipe capable of allocating a predetermined PCD time or the like can be easily achieved without any problem or requiring a time.

Here, the PCD time, PED time and the like, each have a correlation with a circuit line width or a film quality state. Thus, the circuit line width or film quality state can be estimated by estimation, calculating, and displaying the PCD time. In addition, the degree of a difference in circuit line width can be grasped by estimating, calculating, and displaying the PED time. In this duration, the wafer transfer schedule is automatically created by creating the wafer flow recipe in which the PCD time and the PED time are within a desired range. Based on the prepared schedule, processing is carried out. Therefore, such a resist pattern forming device can form a resist pattern with a desired circuit line width and film quality.

According to the present invention, a recommended transfer route may be displayed such that the specified PCD time, PAD time, and PED time are within a predetermined range of deviation. For example, in the case of the PCD time, there may be considered two transfer routes, that is, a route of direct transfer from the coating unit (COT) to the first heating unit (PAB); and a route of transfer to the first heating unit (PAB) via the delivery unit (TRS). In the case of direct transfer to the heating unit (PAB), a wafer does not stay in an intermediate module until it has been transferred to the heating unit (PAB). Thus, a difference in transfer process time hardly occurs. In contrast, in the case of transfer via the delivery unit (TRS), a wafer stays in the delivery unit (TRS) until it has been transferred to the heating unit (PAB). This stay time varies depending on the time of each transfer cycle, resulting in a difference in PCT Time.

In the case where, for example, a wafer flow recipe of COT→TRS→PAB has been prepared, the control section 4 displays on a panel the information indicating that a deviation can be reduced more significantly in route of COT→PAB. Further, in the case where a wafer flow recipe of "PAB→CPL→TRS→WEE→SBU→CPL of interface section B3→Exposure B4 has been prepared, the control section 4 displays on a panel the information indicating that a deviation can be reduced more significantly in route of PAB→CPL→WEE→SBU→CPL of interface section B3→exposure device. In this manner, by proposing the transfer route which causes a less deviation, a work of wafer flow recipe preparation of a process engineer can be reduced.

According to the present embodiment, by changing the type or quantity and layout of modules allocated in rack units U1 to U9, the PCT Time, PAD time, the PED time and the like are varied according to the wafer flow recipe. Thus, it is effective to estimate and calculate the PCD time or the like by preparing the wafer flow recipe in order to allocate a wafer flow recipe which does not affect a process for a circuit line width or the like.

Moreover, according to the present invention, any one or two parameters of the PCR Time, PAD time, and PED time may be predicted and calculated or all the parameters may be predicted and calculated. In the case where the two or more parameters are displayed after estimated and calculated, it becomes possible to adjust a wafer flow recipe with reference to the respective calculation results, and obtain a wafer flow recipe which least affects a process, for example, such a wafer flow recipe having the least deviation in circuit line width.

The present invention can be applied to a coating and developing apparatus which processes a glass substrate (LCD substrate) for a liquid crystal display as well as a semiconductor wafer.

What is claimed is:

1. A coating and developing apparatus comprising:
a module group which processes a plurality of substrates in parallel, the module group including a resist coating unit, a first heating unit which carries out a first heating process of a resist coated film before an exposure process, and a developing unit which carries out a developing process of a resist coated film after the exposure process; and
a plurality of substrate transfer mechanisms configured to transfer a substrate to each unit of the module group, the apparatus having;
a substrate flow recipe creation section which specifies a transfer sequence of substrates for each unit of the module group to create a substrate flow recipe;
an estimated time calculating section which, based on the substrate flow recipe, estimates and calculates a first time interval from a time point at which a process for coating a resist liquid on the substrate by the coating unit has been terminated to a time point at which the first heating process is started at the first heating unit; and
an estimated time display section which displays the estimated and calculated time by the estimated time calculating section.

2. The apparatus according to claim 1, wherein the estimated time calculating section estimates and calculates a second time interval from a time point at which the first heating process has been terminated at the first heating unit to a time point at which the exposure process is started, based on the substrate flow recipe.

3. The apparatus according to claim 1, wherein the module group further has a second heating unit which carries out a second heating process to the resist coated film after the exposure process.

4. The apparatus according to claim 3, wherein the estimated time calculating section estimates and calculates a third time interval from a time point at which the exposure process has been terminated to a time point at which the second heating process is started at the second heating unit, based on the substrate flow recipe.

5. The apparatus according to claim 1, further having an enforceability inspecting section which inspects enforceability of a process carried out by said each unit with reference to a recipe having recorded therein a time of processing carried out by said each unit and a time of transferring substrate.

6. A coating and developing apparatus comprising:
a module group which processes a plurality of substrates in parallel, the module group including a resist coating unit, a first heating unit which carries out a first heating process of a resist coated film before an exposure process, and a developing unit which carries out a developing process of a resist coated film after the exposure process; and a plurality of substrate transfer mechanisms configured to transfer a substrate to each unit of the module group, the apparatus having;

a substrate flow recipe creation section which specifies a transfer sequence of substrates for each unit of the module group to create a substrate flow recipe;

an estimated time calculating section which, based on the substrate flow recipe, estimates and calculates a second time interval from a time point at which a first heating process has been terminated at the first heating unit to a time point at which the exposure process is started; and an estimated time display section which displays the estimated and calculated time by the estimated time calculating section.

7. The apparatus according to claim 6, wherein the estimated time calculating section estimates and calculates a first time interval from a time point at which a process for coating a resist liquid on the substrate by the coating unit has been terminated to a time point at which the first heating process is started at the first heating unit, based on the substrate flow recipe.

8. The apparatus according to claim 6, wherein the module group further has a second heating unit which carriers out a second heating process to the resist coated film after the exposure process.

9. The apparatus according to claim 8, wherein the estimated time calculating section estimates and calculates a third time interval from a time interval at which the exposure process has been terminated to a time point at which the second heating process is started at the second heating unit, based on the substrate flow recipe.

10. The apparatus according to claim 6, further having an enforceability inspecting section which inspects enforceability of a process carried out by said each unit with reference to a recipe having recorded therein a time of processing carried out by said each unit and a time of transferring substrate.

11. A coating and developing apparatus comprising:

a module group which processes a plurality of substrates in parallel, the module group including a resist coating unit, a second heating unit which carries out a second heating process of a resist coated film after an exposure process, and a developing unit which carries out a developing process of the resist coated film after the exposure process; and a plurality of substrate transfer mechanisms configured to transfer a substrate to each unit of the module group, the apparatus having:

a substrate flow recipe creation section which specifies a transfer sequence of substrates for each unit of the module group to create a substrate flow recipe;

an estimated time calculating section which, based on the substrate flow recipe, estimates and calculates a third time interval from a time point at which the exposure process has been terminated to a time point at which a second heating process is started at the second heating unit; and an estimated time display section which displays the estimated and calculated time by the estimated time calculating section.

12. The apparatus according to claim 11, wherein the module group further has a first heating unit for carrying out a first heating process for a resist coated film before the exposure process.

13. The apparatus according to claim 12, wherein the estimated time calculating section estimates and calculates a first time interval from a time point at which a process for coating a resist liquid on the substrate by the coating unit has been terminated to a time point at which the first heating process is started at the first heating unit, based on the substrate flow recipe.

14. The apparatus according to claim 12, wherein the estimated time calculating section estimates and calculates a second time interval from a time point at which the first heating process has been terminated at the first heating unit to a time point at which the exposure process is started, based on the substrate flow recipe.

15. The apparatus according to claim 11, further having an enforceability inspecting section which inspects enforceability of a process carried out by said each unit with reference to a recipe having recorded therein a time of processing carried out by said each unit and a time of transferring substrate.

16. A computer readable medium encoded with a computer program to be executed by a computer system, the program controlling a coating and developing apparatus, the coating and developing apparatus comprising a module group which processes a plurality of substrates, the module group including a resist coating unit, a first heating unit which carriers out a first heating process for a resist coated film before an exposure process, and a developing unit which carriers out a developing process for a resist coated film after the exposure process; and a plurality of substrate transfer means for transferring a substrate to each unit of the module group, the computer readable medium encoded with a computer program comprising:

(a) a procedure for executing processing of specifying a transfer sequence of substrates for each unit of the module group to create a substrate flow recipe;

(b) a procedure for executing processing of, based on the substrate flow recipe, estimating and calculating a first time interval from a time point at which a process for coating a resist liquid on the substrate by the coating unit has been terminated to a time point at which the first heating process is started at the first heating unit; and (c) a procedure for executing processing of displaying the estimated and calculated time.

17. A computer readable medium encoded with a computer program to be executed by a computer system, the program controlling a coating and developing apparatus, the coating and developing apparatus comprising a module group which processes a plurality of substrates, the module group including a resist coating unit, a first heating unit which carriers out a first heating process for a resist coated film before an exposure process, and a developing unit which carriers out a developing process for a resist coated film after the exposure process; and a plurality of substrate transfer mechanisms configured to transfer a substrate to each unit of the module group, the computer readable medium encoded with a computer program comprising:

(a) a procedure for executing processing of specifying a transfer sequence of substrates for each unit of the module group to create a substrate flow recipe;

(b) a procedure for executing processing of, based on the substrate flow recipe, estimating and calculating a second time interval from a time point at which a first heating process has been terminated at the first heating unit to a time point at which the exposure process is started; and (c) a procedure for executing processing of displaying the estimated and calculated time.

18. A computer readable medium encoded with a computer program to be executed by a computer system, the program controlling a coating and developing apparatus, the coating and developing apparatus comprising a module group which processes a plurality of substrates, the module group including a resist coating unit, a second heating unit which carriers out a second heating process for a resist coated film after an exposure process, and a developing unit which carriers out a developing process for the resist coated film after the exposure process; and a plurality of substrate transfer mechanisms configured to transfer a substrate to each unit of the module group, the computer readable medium encoded with a computer program comprising:
(a) a procedure for executing processing of specifying a transfer sequence of substrates for each unit of the module group to create a substrate flow recipe;
(b) a procedure for executing processing of, based on the substrate flow recipe, estimating and calculating a third time interval from a time point at which the exposure process has been terminated to a time point at which the second heating process is started at the second heating unit; and
(c) a procedure for executing processing of displaying the estimated and calculated time.

* * * * *